United States Patent
Nanjo et al.

(10) Patent No.: US 6,900,088 B2
(45) Date of Patent: May 31, 2005

(54) SEMICONDUCTOR DEVICE AND ITS MANUFACTURE METHOD

(75) Inventors: Ryota Nanjo, Kawasaki (JP); Shinji Sugatani, Kawasaki (JP); Satoshi Nakai, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 10/084,367

(22) Filed: Feb. 28, 2002

(65) Prior Publication Data

US 2002/0127791 A1 Sep. 12, 2002

(30) Foreign Application Priority Data

Mar. 9, 2001 (JP) .................................. 2001-067164
Aug. 27, 2001 (JP) .................................. 2001-256108

(51) Int. Cl.$^7$ ................. H01L 21/8232; H01L 21/8234
(52) U.S. Cl. ................... 438/210; 438/238; 438/275; 438/382; 438/383; 438/530
(58) Field of Search ........................ 438/210, 223, 438/227, 229–231, 238, 383, 382, 275, 530; 257/358, 379, 336, 344, 350, 408

(56) References Cited

U.S. PATENT DOCUMENTS

| | | | | |
|---|---|---|---|---|
| 4,622,735 A | * | 11/1986 | Shibata | 438/143 |
| 5,498,887 A | * | 3/1996 | Ohki et al. | 257/239 |
| 5,610,088 A | * | 3/1997 | Chang et al. | 438/231 |
| 5,668,024 A | * | 9/1997 | Tsai et al. | 438/199 |
| 5,747,852 A | * | 5/1998 | Chang et al. | 257/336 |
| 5,773,339 A | * | 6/1998 | Okamoto | 438/210 |
| 5,780,350 A | * | 7/1998 | Kapoor | 438/305 |
| 5,956,603 A | | 9/1999 | Talwar et al. | 438/520 |
| 6,153,455 A | * | 11/2000 | Ling et al. | 438/231 |
| 6,255,152 B1 | * | 7/2001 | Chen | 438/199 |
| 6,309,937 B1 | * | 10/2001 | Lin | 438/305 |

FOREIGN PATENT DOCUMENTS

| | | |
|---|---|---|
| JP | 05-067776 | 3/1993 |
| JP | 06-053157 | 2/1994 |
| JP | 07-231044 | 8/1995 |
| JP | 2000-196037 | 7/2000 |
| JP | 2000-269491 | 9/2000 |
| JP | 2001-007220 | 1/2001 |

OTHER PUBLICATIONS

Wolf, Ph.D., Stanley, "CMOS Process Integration," Silicon Processing for the VLSI Era: Vol. 2—Process Integration, Lattice Press, 1986, pp. 428–431.*
Wolf, Ph.D., Stanley, Richard N. Tauber, "Ion Implantation for VLSI," Sillicon Processing for VSLI Era—vol. 1: Process Technology, Lattice Press, 1986, pp. 303–308.*

(Continued)

*Primary Examiner*—Mary Wilczewski
*Assistant Examiner*—Toniae M. Thomas
(74) *Attorney, Agent, or Firm*—Westerman, Hattori, Daniels & Adrian, LLP

(57) ABSTRACT

First and second gate electrodes are formed on first and second regions of a semiconductor substrate. Second conductivity type impurities are implanted into the second region to form first impurity diffusion regions. Spacer films are formed on the side surfaces of the first and second gate electrodes. Second conductivity type impurities are implanted into the first and second regions to form second impurity diffusion regions. After the spacer films are removed, second conductivity type impurities are implanted into the first region to form third impurity diffusion regions. The third activation process is performed so that the gradient of impurity concentration distribution around the third impurity diffusion region becomes steeper than the gradient of impurity concentration distribution around the first impurity diffusion region.

8 Claims, 27 Drawing Sheets

OTHER PUBLICATIONS

Wolf, Ph.D., Stanley, Richard Tauber, Ph.D., "Crystalline Defects, Thermal Processing, and Gettering," Silicon Processing for the VSLI Era—vol. 1: Process Technology, Lattice Press, 1986, pp. 56–58.*

"Activation and Deactivation of Laser Thermal Annealed Boron, Arsenic, Phosphorus and Antimony Ultra–Shallow Abrupt Junctions", Murto et al; TH–13; Ion Implantation Technology 2000.

"Self–Aligned Nickel–Mono–Silicide Technology for High– Speed Deep Submicrometer Logic CMOS USI", Morimoto et al; vol. 42, No. 5, May 1995 IEEE, pp 915–923.

70nm MOSFET with Ultra–shallow, Abrupt, and Super–doped S/D Extension Implemented by Laser Thermal Process (LTP); Bin Yu et al; 1999 IEEE.

"Front End Processes"; International Technology Roadmap for Semiconductors 1999; pp 105–141.

* cited by examiner

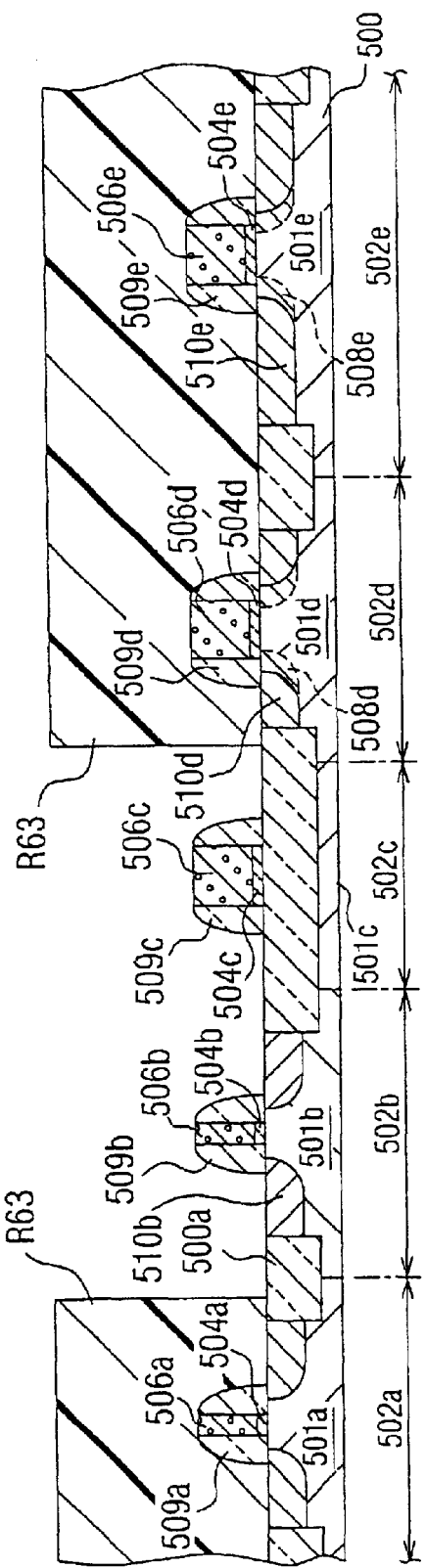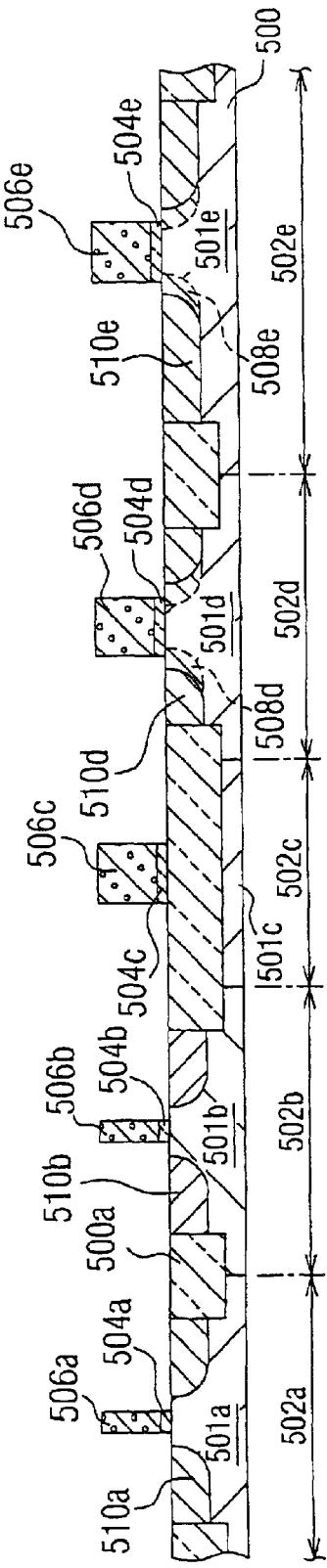
FIG. 8E
FIG. 8F

SEMICONDUCTOR DEVICE AND ITS MANUFACTURE METHOD

This application is based on Japanese Patent Applications 2001-067164 filed on Mar. 9, 2001, and 2001-256108 filed on Aug. 27, 2001, the entire contents of which are incorporated herein by reference.

BACKGROUND OF THE INVENTION a) Field of the Invention

This invention relates to a semiconductor device and its manufacture method, and more particularly to techniques of forming a semiconductor device which requires impurity diffusion regions having different impurity profiles on the same substrate. For example, such a device has a high speed transistor having a fine gate capable of high speed operation and a high voltage transistor.

b) Description of the Related Art

In order to realize a high performance of a semiconductor device with MOS type transistors, it is indispensable to make MOS type transistors very fine. Especially, by shortening the channel length of a MOS type transistor, that is, the gate length, high speed of the semiconductor device can be remarkably improved. To decrease the influence of a so-called, short channel effect when the gate length is shortened, it is preferred to adopt a source drain extension (SDE) structure.

For instance, by forming sidewall spacer films or the like on the side surfaces of a gate electrode after forming the gate electrode, source/drain regions are formed spaced apart from the edges of the gate electrode. Impurity diffusion regions having a shallower junction depth than the source/drain impurity diffusion regions and the same conductivity type as the source/drain diffusion regions are formed in space regions between the gate and source/drain regions. This structure is called an SDE structure. It is called a lightly doped drain (LDD) structure, a medium doped drain (MDD) structure, and a highly doped drain (HDD) structure, and the like, sequentially from the region with a lower impurity concentration in the SDE structure.

The extension region is generally considered as a region having a relatively high impurity concentration. However, in this specification, the term named the SDE structure or SDE region is intended to mean the structure or region having a shallower junction depth than the source/drain impurity diffusion regions and the same conductivity type as the source/drain regions and formed in the space regions, irrespective of whether the impurity concentration is high or low.

For instance, if the gate length of a transistor is set to 50 nm, it is preferred to set the thickness of an impurity diffusion region constituting the SDE structure to about 20 nm to 30 nm (refer to SIA load map, 1999).

For instance, to form an SDE region, after impurity ions are injected in a semiconductor substrate, an ion activation process is performed by using a rapid thermal annealing (RTA) method or a laser thermal process (LTP) method. In the RTA and LTP methods, the speed of the temperature rise and fall is increased from a usual thermal anneal (TA) method. The RTA method will change the temperature of an entire semiconductor substrate in a short time. On the other hand, the LTP method can raise the activation rate of impurities by irradiating a laser beam to the surface of a semiconductor substrate in ultra short time. With the LTP method, it is possible to form near to the semiconductor substrate a junction which is very shallow and has a steeply changing impurity concentration.

If ion implantation and ion activation are used together, it is possible to adjust an impurity concentration, a steepness of the impurity concentration profile in the depth direction, and a thickness of an impurity diffusion region.

There are many cases that a semiconductor integrated circuit device has transistors of different types on the same substrate. For example, high speed transistors (hereinafter called a "high speed transistor") having a short gate length and operating at a low voltage, e.g., about 1.6 V and transistors (hereinafter called a "high voltage transistor") constituting an input/output (I/O) circuit and operating at a high voltage, e.g., about 3.3 V, are formed together on the same substrate.

FIG. 9A and FIG. 9B are cross sectional views of two kinds of semiconductor devices having a high speed transistor and a high voltage transistor incorporating the SDE structure and formed on same substrates.

FIG. 9A is a cross sectional view showing the structure suitable for forming a high voltage transistor with SDE regions.

As shown in FIG. 9A, a first region 602 and a second region 603 are defined in a p-type silicon substrate 600 by an element isolation region 600a. In the first region 602, a high speed transistor with a short gate length is formed. A first gate electrode 606 of the high speed transistor is formed on a gate insulating film 604 formed on the p-type silicon substrate 600. A high voltage transistor with a long gate length is formed in the second region 603. A second gate electrode 607 of the high voltage transistor is formed on a gate insulating film 605 formed on the p-type silicon substrate 600.

The high speed transistor and high voltage transistor each have n-type SDE regions 611 extending from the region just under the gate electrode to the outer surface layer of the semiconductor substrate and n-type source/drain regions 610 continuous with the SDE regions 611.

Spacer films 612 are formed on the side surfaces of the first and second gate electrodes 606 and 607. The SDE region 611 is formed in the surface layer of the semiconductor substrate just under the spacer film 612.

A metal silicide layer 613 such as CoSi may be formed on the upper surfaces of the first and second gate electrodes 606 and 607 and source/drain regions 610. If the metal silicide layer 613 is formed, the sheet resistances of the gate electrode and source/drain regions lower.

In order to prevent on-current from being reduced by hot carriers, it is preferable to form the SDE region of the high voltage transistor so that the p-n junction between the n-type SDE region 611 and underlying p-type semiconductor region (or p-type silicon substrate) 600 has a gentle gradient of n-type impurity concentration.

However, if the SDE region of the high speed transistor with a short gate length has also the gentle gradient of the impurity concentration, the short channel effect becomes remarkable.

FIG. 9B is a cross sectional view showing the structure suitable for forming a high speed transistor with SDE regions. In FIG. 9B, like constituent elements to those shown in FIG. 9A are represented by reference numerals obtained by adding 100 to the numerals shown in FIG. 9A, and the description thereof is omitted.

In the structure shown in FIG. 9B, a first region 702 and a second region 703 are defined in a p-type silicon substrate 700. In these regions 702 and 703, n-type SDE regions 711 are formed having the same structure for both the high speed and high voltage transistors.

In order to make the SDE region 711 suitable for a high speed transistor, i.e., to improve high speed operation (reduce the source resistance) and suppress the short channel effect, the SDE region 711 is formed in such a manner that the n-type impurity concentration is high and that the p-n junction between the n-type SDE region 711 and p-type semiconductor region (or p-type silicon substrate) 700 has a gentle gradient of the n-type impurity concentration.

However, if the SDE region of the high voltage transistor is also formed, the p-n junction has a steep change in the n-type impurity concentration and the on-current (Ion) of the transistor lowers by hot carriers. Namely, if the transistor is driven at a high voltage, the electric field under the gate insulating film (at the edge of the drain) becomes large. A large number of hot carriers are therefore generated and the on-current lowers. In order to mitigate the influence of the electric field, it is necessary to device the SDE structure.

In the case of a resistor element made of an n-type impurity diffusion region in a semiconductor substrate with a high speed transistor, if the p-n junction between the n-type resistor element and underlying p-type semiconductor region (or p-type silicon substrate) has a steep impurity concentration gradient, leak current to the substrate increases.

SUMMARY OF THE INVENTION

It is an object of the present invention to provide techniques of efficiently forming on the same substrate high speed transistors having SDE regions with a shallow and steep impurity profile, and elements having impurity diffusion regions having an impurity profile different from that of the high speed transistor.

According to one aspect of the present invention, there is provided a method of manufacturing a semiconductor device, comprising steps of: (a) preparing a semiconductor substrate having first and second regions of a first conductivity type defined in a principal surface area of the semiconductor substrate; (b) forming first and second gate electrodes in partial areas of the first and second regions; (c) by using the second gate electrode as a mask, implanting impurities of a second conductivity type opposite to the first conductivity type into a surface layer in the second region and thereafter executing a first activation process to form first impurity diffusion regions; (d) forming first spacer films on side surfaces of the first and second gate electrodes; (e) by using the first and second gate electrodes and the first spacer films as a mask, implanting impurities of the second conductivity type into surface layers in the first and second regions and thereafter executing a second activation process to form second impurity diffusion regions; (f) removing the first spacer films; and (g) by using the first gate electrode as a mask, implanting impurities of the second conductivity type into a surface layer in the first region and thereafter executing a third activation process to form third impurity diffusion regions, wherein the third activation process is executed so that the gradient of an impurity concentration distribution in a p-n junction formed by the third impurity diffusion region becomes steeper than the gradient of an impurity concentration distribution in a p-n junction formed by the first impurity diffusion region formed by the first activation process.

After the third impurity diffusion regions having a steeper gradient of the impurity concentration distribution in the p-n junction are formed, a heat treatment for activation is not preformed so that excessive diffusion of impurities can be prevented. It is therefore possible to suppress the short channel effect and non-activation of impurities in the high speed transistor. It is also possible to make the SDE region of the high voltage transistor have a p-n junction with a gentle gradient of impurity concentration distribution. Reduction in the on-current to be caused by the generation of hot carriers can be prevented.

According to another aspect of the invention, there is provided a method of manufacturing a semiconductor device, comprising steps of: (a) preparing a semiconductor substrate having first and second regions of a first conductivity type defined in a principal surface area of the semiconductor substrate; (b) forming at least a first gate electrode in a partial area of the first region; (c) implanting impurities of a second conductivity type opposite to the first conductivity type into a surface layer of the second region, and thereafter executing a first activation process to form first impurity diffusion regions; (d) forming first spacer films on side surfaces of the first gate electrode; (e) by using the first gate electrode and first spacer films as a mask, implanting impurities of the second conductivity type into a surface layer of the first region, and thereafter executing a second activation process to form second impurity diffusion regions; (f) removing the first spacer films; and (g) by using the first gate electrode as a mask, implanting impurities of the second conductivity type into a surface layer in the first region and thereafter executing a third activation process to form third impurity diffusion regions, wherein the third activation process is executed so that the gradient of an impurity concentration distribution in a p-n junction formed by the third impurity diffusion region becomes steeper than the gradient of an impurity concentration distribution in a p-n junction formed by the first impurity diffusion region formed by the first activation process.

With this semiconductor device manufacture method, impurity diffusion regions having three kinds of different impurity concentration profiles can be formed in the same semiconductor substrate.

The impurity diffusion region having a steep gradient of an impurity concentration distribution in the p-n junction formed with the semiconductor substrate or with a first conductivity type semiconductor layer formed on the substrate is formed by the final activation process. Therefore, the steepness of the gradient of impurity concentration distribution can be maintained unchanged and the short channel effect of a high speed transistor can be suppressed. Further, since a resistor element made of an impurity diffusion layer has a p-n junction whose impurity concentration gradient is gentler than the impurity diffusion region having a steeper impurity concentration gradient in the p-n junction, it is possible to prevent the characteristics of the resistor element from being degraded by leak current.

According to a further aspect of the present invention, there is provided a method of manufacturing a semiconductor device, comprising steps of: (a) preparing a semiconductor substrate having a first region of a first conductivity type and a second region filled with an element separation insulating film, respectively defined in a principal surface area of the semiconductor substrate; (b) forming a gate electrode at least in a partial area of the first region and a resistor layer made of material same as the gate electrode at least in a partial area of the second region; (c) forming first and second spacer films on side walls of the gate electrode and the resistor layer; (d) implanting impurities of a second conductivity type opposite to the first conductivity type into a surface layer in the first region by using the gate electrode and the first spacer films as a mask, and also into the resistor layer, and then executing a first activation process to thereby form first impurity diffusion regions in the surface layer in the first region and lower a resistance of the resistor layer; (e) removing the first and second spacer films; (f) implanting impurities of the second conductivity type into the surface layer in the first region by using the gate electrode as a mask, and then executing a second activation process to thereby form second impurity diffusion regions, wherein the second activation process is performed under a condition that a gradient of an impurity concentration distribution in a p-n junction in each of the second impurity diffusion regions becomes sharper than a gradient of an impurity concentration distribution in a p-n junction in each of the first impurity diffusion regions formed by the first activation process.

According to a further aspect of the present invention, there is provided a method of manufacturing a semiconductor device, comprising steps of: (a) preparing a semiconductor substrate having first and second regions of a first conductivity type and a third second region filled with an element separation insulating film, respectively defined in a principal surface area of the semiconductor substrate; (b) forming first and second gate electrodes at least in partial areas of the first and second regions and a resistor layer made of material same as the first and second gate electrodes at least in a partial area of the second region; (c) implanting impurities of a second conductivity type opposite to the first conductivity type into the second region by using the second gate electrode as a mask and thereafter executing a first activation process to thereby form first impurity diffusion regions in a surface layer in the second region; (d) forming first spacer films on side walls of the first and second gate electrodes and second spacer films on side walls of the resistor layer; (e) implanting impurities of the second conductivity type at least in surface layers of the first and second regions by using the first and second gate electrodes and the second spacer films as a mask, and also into the resistor layer, and thereafter executing a second activation process to thereby form second impurity diffusion regions at least in the surface layer of the first or second region and lower a resistance of the resistor layer; (f) removing the first and second spacer films; and (g) implanting impurities of the second conductivity type into the surface layer in the first region by using the first gate electrode as a mask and thereafter executing a third activation process to thereby form third impurity diffusion regions, wherein the third activation process is performed under a condition that a gradient of an impurity concentration distribution in a p-n junction in each of the third impurity diffusion regions becomes sharper than a gradient of an impurity concentration distribution in a p-n junction in each of the first impurity diffusion regions formed by the first activation process.

According to the semiconductor device manufacture methods described above, at the same time when the source/drain regions are formed in at least one of the first and second element regions, the resistance of the resistor layer can be lowered.

According to a further aspect of the present invention, there is provided a semiconductor device comprising: a semiconductor substrate having first and second regions of a first conductivity type defined in a principal surface area of the semiconductor substrate; first and second gate electrodes formed in the first and second regions; first SDE regions formed in a surface layer on both sides of the second gate electrode and doped with impurities of a second conductivity type opposite to the first conductivity type; second SDE regions formed in a surface layer on both sides of the first gate electrode wherein the gradient of an impurity concentration distribution in a p-n junction formed by the second SDE is steeper than the gradient of an impurity concentration distribution in a p-n junction formed by the first impurity diffusion region; and source/drain regions formed on both sides of the first and second SDE regions wherein an impurity concentration distribution is the same in both p-n junctions formed by the source/drain regions in the first and second regions.

In this semiconductor device, the gradient of impurity concentration distribution in the p-n junction between the second SDE region and the underlying first conductivity type impurity diffusion region or semiconductor substrate is steep, so that the short channel effect of a high speed transistor can be suppressed. Further, since the first SDE region of a high voltage transistor has a p-n junction whose impurity concentration gradient is gentler than the p-n junction of the second SDE region of the high speed transistor, reduction of on-current to be caused by the generation of hot carriers can be prevented. Since the source/drain regions in both the first and second regions are formed at the same time and subjected thereafter to the same thermal history, the impurity concentration distribution in the p-n junctions is the same in both the first and second regions.

According to the invention, without increasing the number of processes, it is possible to form, on the same substrate, high speed transistors having a steep gradient of impurity concentration distribution in a p-n junction and high voltage transistors having a gentler gradient than the p-n junction of the high speed transistor. It is therefore possible to suppress the short channel effect of a high speed transistor and suppress the reduction in on-current of a high voltage transistor to be caused by hot carriers.

Since a resistor element is formed by using a resistor layer same as that of a gate electrode of a high speed transistor formed on the same substrate, the resistance of the resistor layer can be lowered at the time of impurity implantation for forming source/drain regions of the high speed transistor. Manufacture processes can be simplified.

In forming an ESD transistor also on the same substrate, a silicidation protective film to be formed in the partial area of the drain region of the ESD transistor and the silicidation protective film to be formed on the resistor layer can be formed by the same process. Manufacture processes are prevented from being complicated.

If a resistor element using an impurity diffusion layer is formed on the same substrate formed with a high speed transistor, leak current of the resistor element can be suppressed.

A semiconductor integrated circuit with high performance and high reliability can be realized.

BRIEF DESCRIPTION OF THE DRAWINGS

FIGS. 8A to 8J are cross sectional views illustrating a semiconductor device manufacturing method according to a fourth embodiment of the invention.

DETAILED DESCRIPTION OF THE PREFERRED EMBODIMENTS

A semiconductor device and its manufacture method according to a first embodiment of the invention will be described with reference to FIGS. 1A to 1H.

Figure 1A:
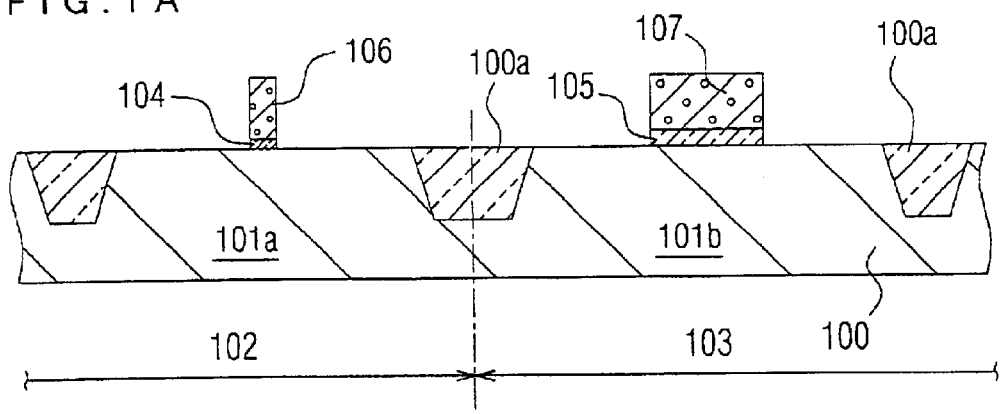
FIGS. 1A to 1H are cross sectional views illustrating a semiconductor device manufacturing method according to a first embodiment of the invention.

As shown in FIG. 1A, an element isolation region 100a is formed in a p-silicon substrate 100 having an impurity concentration of, e.g., $5 \times 10^{15}$ cm$^{-3}$, by shallow trench isolation (STI). In the example shown in FIG. 1A, two kinds of element regions of the first element region 102 and the second element region 103 are defined in the silicon substrate 100 by the element isolation region 100a.

The p-type impurity concentration of a surface layer 101a of the first element region 102 is adjusted to about $5 \times 10^{17}$ cm$^{-3}$ and the p-type impurity concentration of a surface layer 101b of the second element region 103 is adjusted to about $4 \times 10^{16}$ cm$^{-3}$. By changing the p-type impurity concentrations of the surface layer 101a of the first element region 102 and surface layer 101b of the second element region 103, threshold voltages of the transistors to be formed respectively in the first and element regions 102 and 103 can be adjusted.

The surface of the silicon substrate 100 which contains the first and second element regions 102 and 103 is oxidized. The thickness of the silicon oxide film formed on the surface is, for example, 9 nm. Afterwards, a mask is formed on the second element region 103, and the silicon oxide layer formed on the first element region 102 is removed by 9 nm by etching. Thereafter, the surface is again oxidized by 2 nm.

A silicon oxide film 104 of about 2 nm in thickness is therefore left on the first element region 102, and a silicon oxide film 105 of 9.2 nm in thickness is left on the second element region 103. These silicon oxide films 104 and 105 function as gate insulating films.

Next, a polysilicon film of 180 nm in thickness is formed on the substrate. The polysilicon film is patterned to leave a first gate electrode 106, which has a short gate length of, e.g., 50 nm, in the first element region 102, and to leave a second gate electrode 107, which has the relatively long gate length of, e.g., 350 nm, in the second element region 103. The gate electrode, which has the shortest gate length among the first gate electrodes 106, is shorter than the gate electrode which has the shortest gate length among the second gate electrodes 107.

Figure 1B:
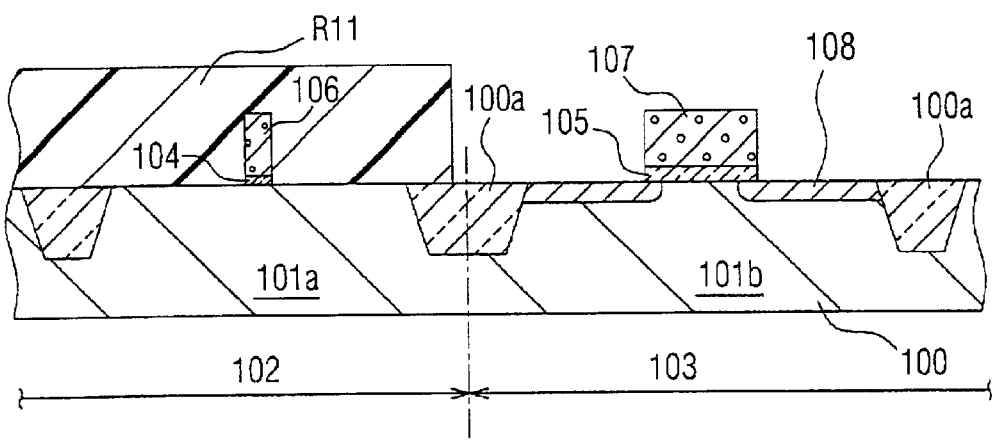

As shown in FIG. 1B, by using a photoresist film R11 covering the first element region 102 as a mask, P (phosphorous) ions are implanted into the second element region 103. For example, the ion implantation conditions are an acceleration energy of 20 keV and a dosage of $4 \times 10^{13}$ cm$^{-2}$. The second gate electrode 107 becomes the mask of ion implantation, and P ions enter the semiconductor region outside of the second gate electrode 107. After the photoresist mask R11 is removed, heat treatment is performed for ten seconds at 1000° C. by RTA or the like. P ions implanted into the substrate is therefore activated.

A first impurity diffusion region 108 having a first n-type impurity concentration profile is therefore formed in the semiconductor region outside of the second gate electrode 107. This first impurity diffusion region 108 becomes an SDE region of a high voltage transistor.

Figure 1C:
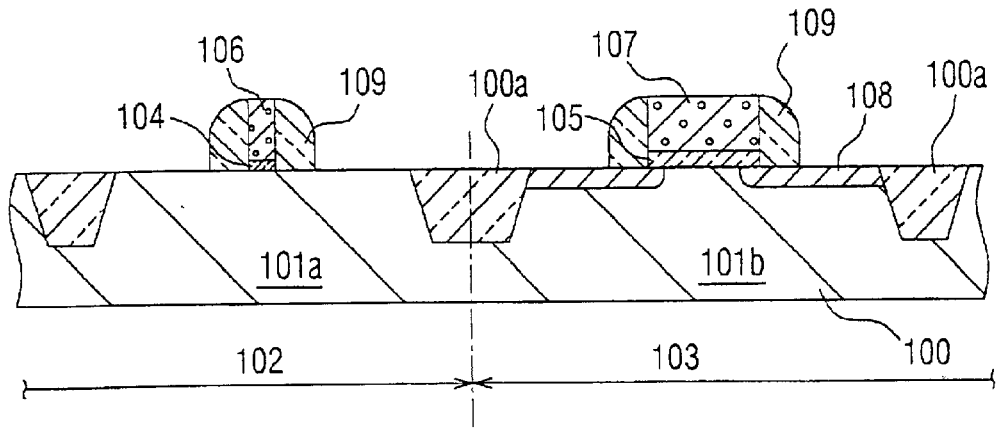

A silicon nitride film (SiN$_x$) is deposited by CVD to a thickness of, e.g., 150 nm. The silicon nitride film is anisotropically etched over the whole surface of the semiconductor substrate 100 through reactive ion etching (RIE). As shown in FIG. 1C, first spacer films 109 are therefore formed on the side surfaces of the first and second gate electrodes 106 and 107.

Figure 1D:
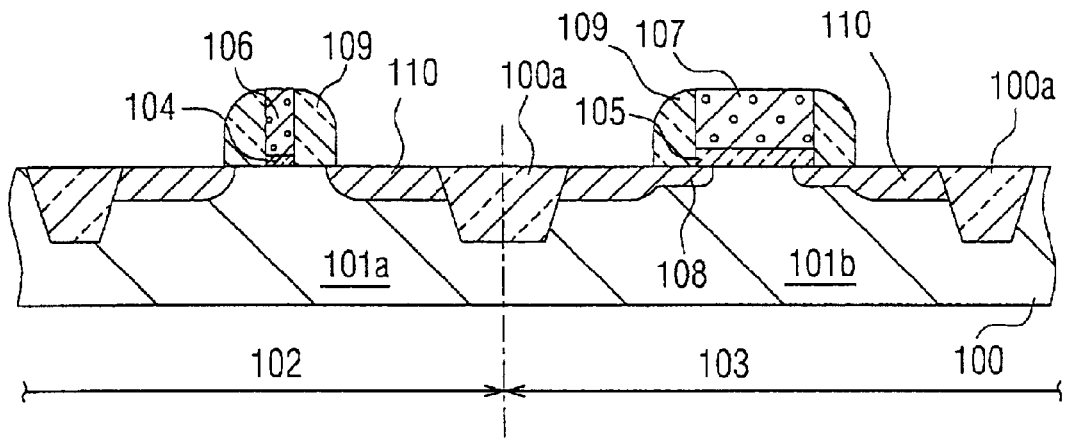

As shown in FIG. 1D, P (phosphorous) ions are implanted in the first and second element regions 102 and 103. The ion implantation conditions are an acceleration energy of 30 keV and a dosage of $2 \times 10^{15}$ cm$^{-2}$. P ions are therefore implanted into the surface layer of the semiconductor substrate 100 outside of the first space films 109 because the first and second gate electrodes 106 and 107 and first spacer films (sidewall insulating films) 109 become the ion implantation masks. Heat treatment is thereafter performed for three seconds at 1025° C. by RTA or the like to activate P ions.

Source/drain regions 110 are therefore formed in the surface layer of the semiconductor substrate 100 outside of the first spacer films 109. The source/drain region 110 has a higher n-type impurity concentration and is deeper than the SDE region 108. In the second element region 103, each of the source/drain regions 110 and the channel region under the second gate electrode 107 are connected by the SDE regions 108. In the first element region 102, each of the source/drain regions 110 and the channel region under the first gate electrode 106 are spaced apart by a distance corresponding to the thickness of the first spacer film 109.

Figure 1E:
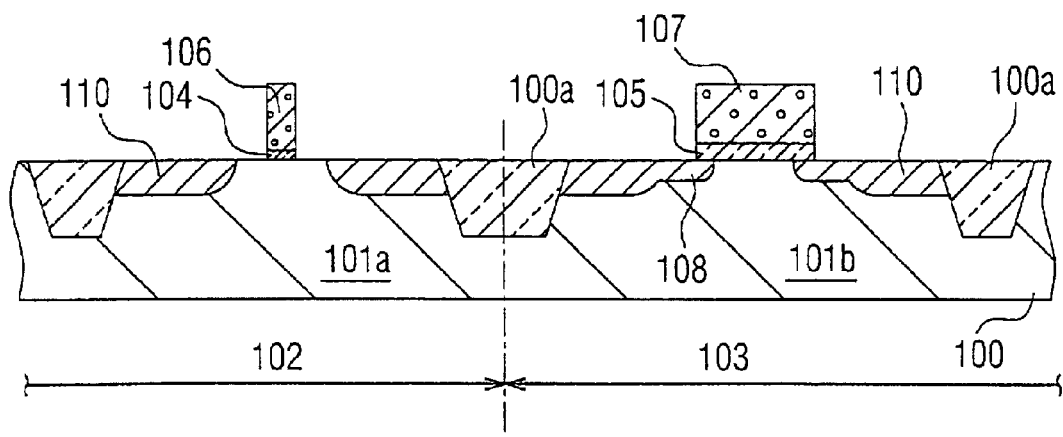

The first spacer film 109 is selectively removed from the gate electrode 106, for example, by wet etching using phosphoric acid. In removing the spacer film 109, chemical dry etching (CDE) with a little damage may be used. As shown in FIG. 1E, the spacer films are removed from the side surfaces of the gate electrodes 106 and 107.

Figure 1F:
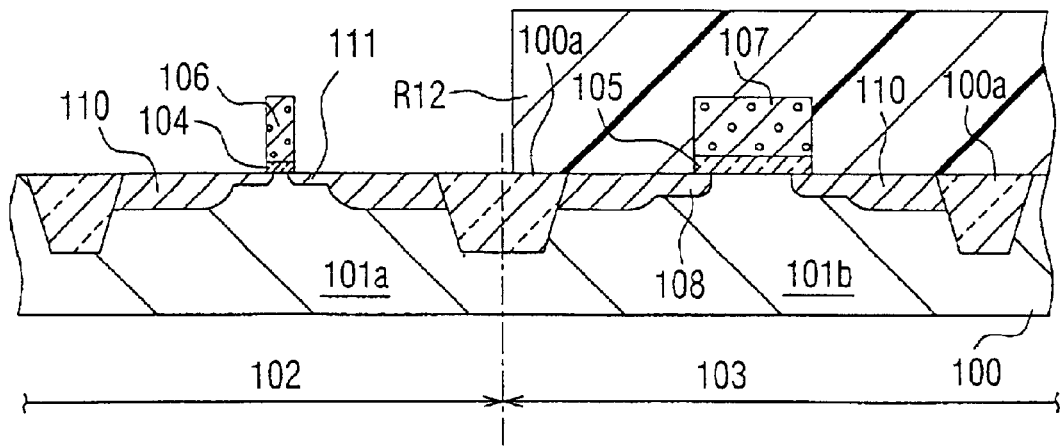

As shown in FIG. 1F, a photoresist mask R12 is formed covering the second element region 103. By using the photoresist mask R12 and first gate electrode 106 as a mask, for example, arsenic (As) ions are implanted into the surface layer of the first element region 102. The ion implantation conditions are an acceleration energy of 5 keV and a dosage of $1 \times 10^{15}$ cm$^{-2}$.

After the photoresist mask R12 is removed, As (arsenic) ions are activated by LTP or the like. LTP is performed by using XeCl pulse laser of 308 nm in wavelength for example. The energy density per laser pulse is, for example, in a range from 200 mJ/cm$^2$ to 400 mJ/cm$^2$.

A third impurity diffusion region (SDE region) 111 is formed in the substrate surface layer between the first gate electrode 106 and each of the source/drain regions 110. The SDE region 111 has a thicker n-type impurity diffusion region and a higher n-type impurity concentration than those of the SDE region 108. The gradient of n-type impurity concentration near at the interface between the SDE region 111 and underlying p-type impurity diffusion region 101a becomes steeper than that of n-type impurity concentration near at the interface between the SDE region 108 and p-type semiconductor region 101b.

Figure 1G:
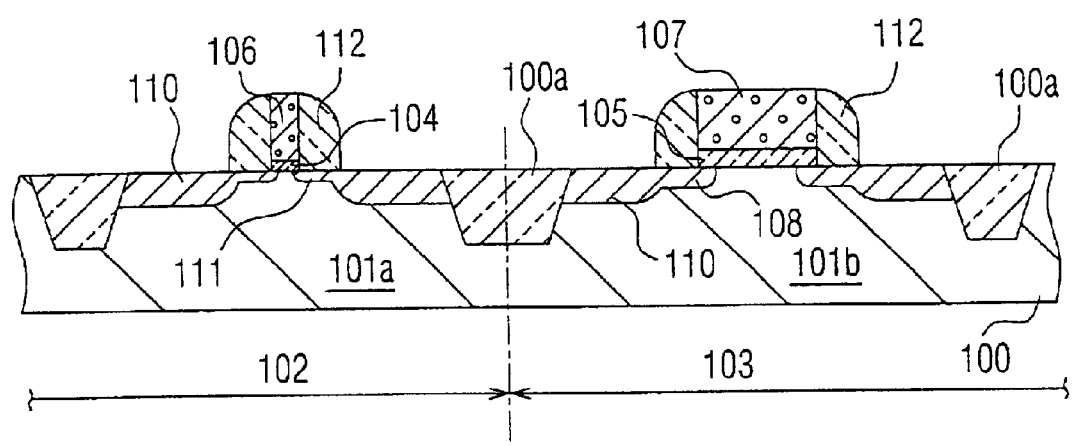

A silicon oxide (SiO2) film of about 150 nm in thickness is deposited by CVD or the like. The silicon oxide film is anisotropically etched over the whole surface of the semiconductor substrate 100 by reactive ion etching (RIE). As shown in FIG. 1G, second spacer films 112 are therefore left on the side surfaces of the first and second gate electrodes 106 and 107.

Figure 1H:
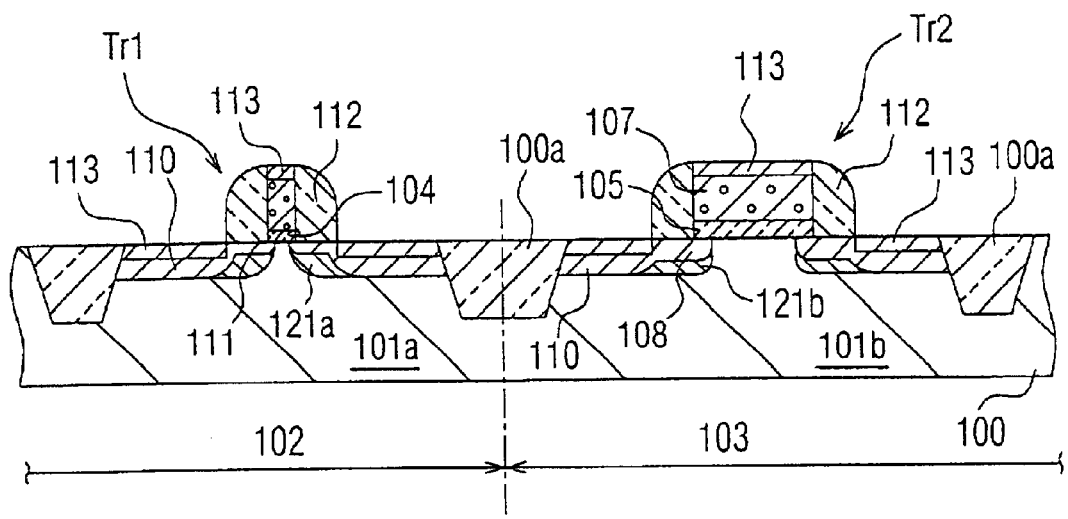

As shown in FIG. 1H, metal silicide layers 113 may be formed on the surface layers of the source/drain regions 110 and on the upper surfaces of the gate electrodes 106 and 107 by using a usual silicide process.

With the semiconductor device manufacture method of the first embodiment described above, the number of processes can be decreased as compared with the case to form two MOS transistors independently. The high speed transistor with a short gate length can be formed in the first element region 102, whereas the high voltage transistor with a comparatively long gate length can be formed in the second element region 103 on the same semiconductor substrate 100. When two kinds of MOSFETs are formed independently, four ion implantation processes and four activation processes are required. In contrast, according to the embodiment method, only three ion implantation processes and three activation processes are required. It is not necessary to increase the number of processes.

The source/drain regions 110 of the high speed and high voltage transistors can have a low sheet resistance and a low contact resistance between the source/drain regions and their wirings, by raising the n-type impurity concentration and by deeply implanting impurities.

In the first SDE region 108 of the high voltage transistor connecting the source/drain region and channel region just under the second gate electrode 107, the p-n junction between the first SDE region and the surface layer 101b having the p-type conductivity has a gentle gradient of n-type impurity concentration. It is therefore possible to suppress a reduction of the on-current to be caused by hot carriers.

The heat treatment for activating impurities in the second SDE region 111 connecting the source/drain region and channel region 110 just under the first gate electrode 106 of the high speed transistor is the last heat treatment. After the second SDE region 111 is formed, there is no heat treatment for activation so that n-type impurities are prevented from being diffused excessively or from not being activated.

The second SDE region 111 has a higher n-type impurity concentration than that of the first SDE region 108. In addition, the gradient of the n-type impurity concentration in the p-n junction formed between the second SDE region 111 and underlying surface layer 101a having the p-type conductivity is maintained steeper than that of the first SDE region 108. It is therefore possible for a high speed transistor to reduce a parasitic resistance and suppress the short channel effect.

Since the source/drain regions both in the first and second element regions are subjected to the same thermal history, there are regions in the first and second element regions, which have the same n-type impurity concentration profile in the depth direction or the same n-type impurity concentration profile of the p-n junction. The region having the same n-type impurity concentration profile is formed in an area, particularly in an area deeper than the thickness of the SDE region formed before the source/drain regions are formed.

When the second SDE region 111 is formed by LTP, an absorber layer such as a metal layer may be formed on the whole surface of the silicon substrate 100. The absorber layer promotes the absorption of laser beams during the laser irradiation process. The absorber layer may be made of a multilayer.

In order to further suppress the short channel effect, a pocket implantation region may be formed under the SDE region by pocket-implanting impurity ions having the conductivity type opposite to that of the impurities in the source/drain regions.

FIG. 1H shows the structure with a pocket implantation region. As shown in FIG. 1H, pocket implantation regions 121a and 121b (including p-type impurity diffusion regions) are formed under the second and first SDE regions 111 and 108. The object of the pocket implantation regions 121a and 121b is mainly to suppress the short channel effect so that the pocket implantation regions may be formed only for the high speed transistor.

For example, Ge ions may be implanted under the conditions of an acceleration energy of 15 keV and a dosage $4 \times 10^{14}$ cm$^{-2}$ before forming the second SDE region 111. With this ion implantation, the surface layer of the silicon substrate 100 can be made amorphous (pre-amorphous process). Thereafter, by performing the ion implantation process and a heat treatment for activation by LTP for the second SDE region, it is possible to selectively activate the amorphous layer and form a shallower and steeper junction.

Instead of LTP, RTA may be used as the heat treatment for activation which is performed when the second SDE region 111 is formed. The heat treatment condition of RTA may be one second at 1000° C.

In the above-described embodiment, the first ion implantation process and the activation process by RTA for 10 seconds at 1000° C. are performed for forming the first SDE region 108. After the first spacer films 109 are formed on the side surfaces of the gate electrodes 106 and 107, the second ion implantation process and the activation process by RTA for 10 seconds at 1000° C. are performed for forming the source/drain regions.

These processes may be replaced by the following processes. That is, the first ion implantation process to form the first SDE region 108 is performed. Before the activation process is performed, after the first spacer films 109 are formed on the side surfaces of the gate electrodes 106 and 107, the second ion implantation process is performed to form the source/drain regions. Next, an ion activation process is performed for activating ions implanted into the first SDE region 108 and source/drain regions. In this manner, one activation process can be omitted. If these processes are used and the conditions suitable for the activation process are different between the first SDE regions 108 and source/drain regions, it is necessary to select one of the conditions to be used or to determine a new condition of the activation process in accordance with two different conditions. As compared to the activation process to be performed under the condition suitable for each region, the condition of the activation process suitable for only one of the two regions becomes out of the optimum condition. Although these processes may also be applied to the embodiments to follow, a similar problem may occur.

Next, a semiconductor device and its manufacture method according to a modification of the first embodiment will be described with reference to FIGS. 2A to 2F.

According to the semiconductor device manufacture method of the first embodiment, after the first SDE region 108 of a high voltage transistor is formed first, the source/drain regions 110 are formed and then the second SDE region 111 is formed. According to the semiconductor device forming method of the modification, the source/drain regions 110 are formed first, then the first SDE region 108 is formed, and lastly the second SDE region 111 is formed. The process conditions and the like are generally similar to those of the first embodiment. Identical constituent elements to those of the first embodiment are represented by using identical reference numerals and the detailed description thereof is omitted.

Figure 2A:
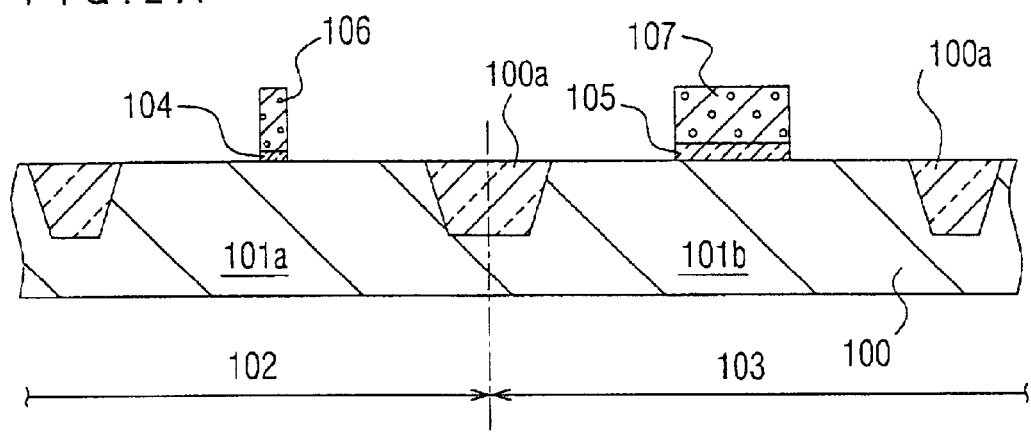
FIGS. 2A to 2F are cross sectional views illustrating a semiconductor device manufacturing method according to a modification of the first embodiment of the invention.
Figure 2B:
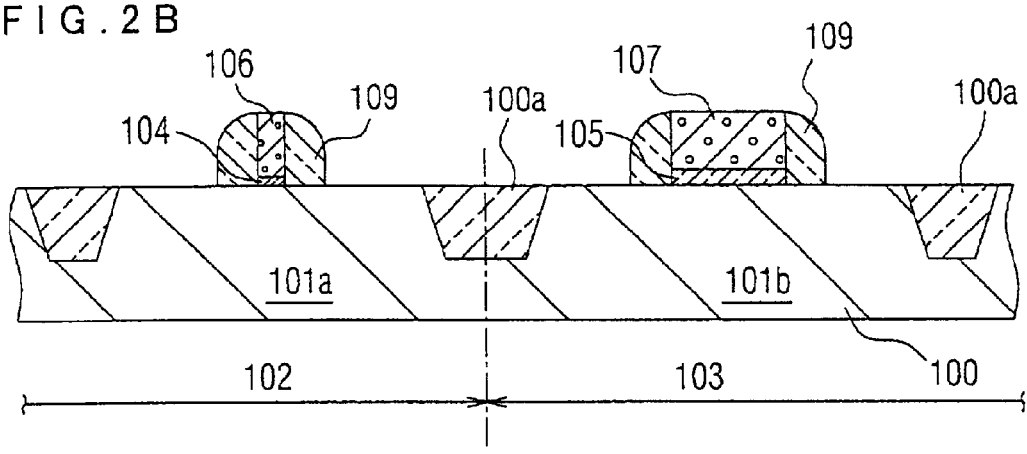
Figure 2C:
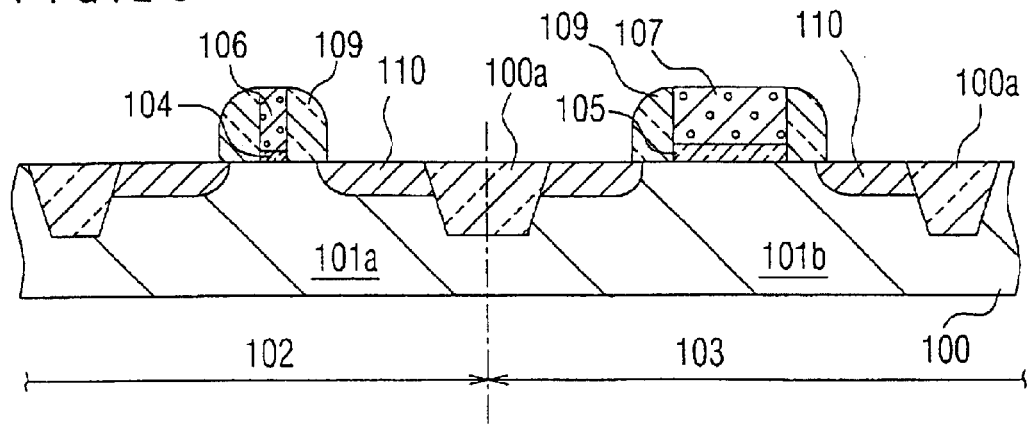

As shown in FIG. 2A, a first gate electrode 106 is formed in a first element region 102 defined in a silicon substrate 100, and a second gate electrode 107 is formed in a second element region 103. As shown in FIG. 2B, spacer films 109 are formed on the side surfaces of the first and second gate electrodes 106 and 107. As shown in FIG. 2C, by using the first and second gate electrodes 106 and 107 and spacer films 109 as a mask, an ion implantation process and an activation process are executed to form source/drain regions 110 on both sides of the gate electrodes.

Figure 2D:
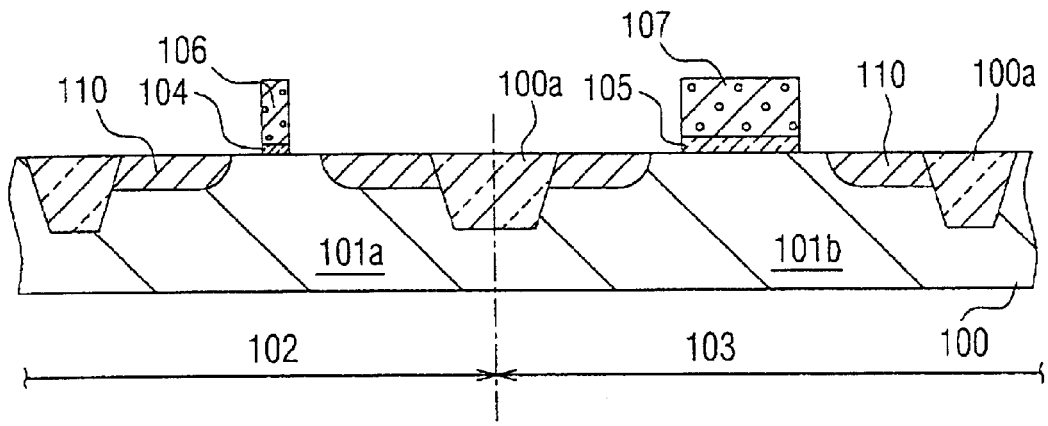
Figure 2E:
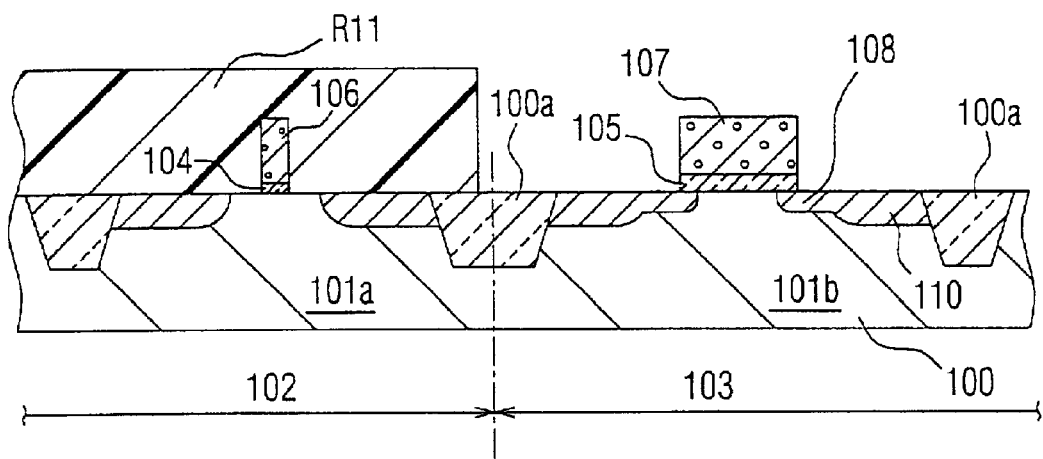
Figure 2F:
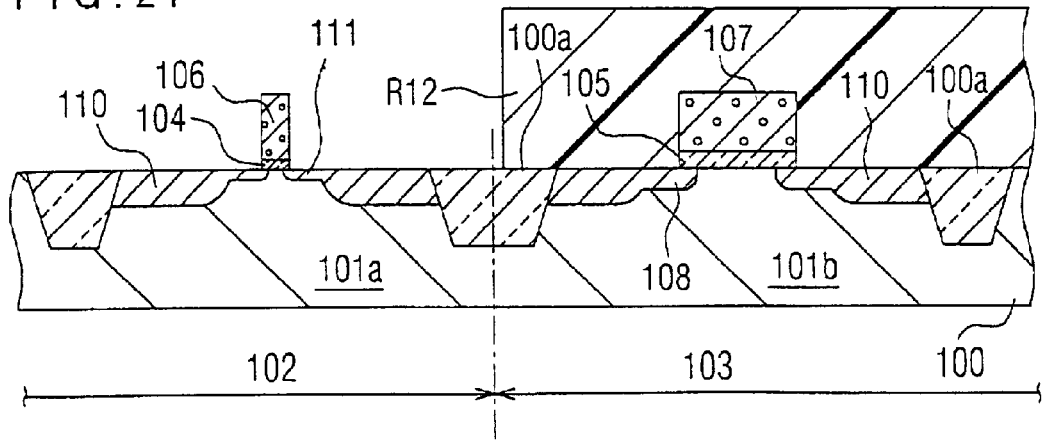

As shown in FIG. 2D, the space films 109 are removed. As shown in FIG. 2E, the first element region 102 is covered with a resist mask R11, and an ion implantation process and an activation process after removing a resist mask R11 are performed for the second element region 103 to form first SDE regions 108 which connect the channel region under the second gate electrode 107 and the source/drain regions 110. As shown in FIG. 2F, the second element region 103 is covered with a resist mask R12, and an ion implantation process and an activation process are performed for the first element region 102 to form second SDE regions 111 which connect the channel region under the first gate electrode 106 and source/drain regions 110.

Thereafter, processes similar to those described with reference to FIGS. 1G to 1H of the first embodiment are executed to complete a semiconductor device.

Also with the semiconductor device manufacture method of this modification, in the first SDE region 108 of the high voltage transistor connecting the source/drain region and channel region just under the second gate electrode 107, the p-n junction between the first SDE region and the surface layer 101b having the p-type conductivity has a gentle gradient of n-type impurity concentration. It is therefore possible to suppress a reduction of the on-current to be caused by hot carriers.

The heat treatment for activating impurities in the second SDE region 111 connecting the source/drain regions and channel region 110 just under the first gate electrode 106 of the high speed transistor is the last heat treatment. After the second SDE region 111 is formed, there is no heat treatment for activation so that n-type impurities are prevented from being diffused excessively or from being de-activated.

With this modified method, however, the source/drain regions 110 are subjected to the thermal history twice so that lateral diffusion of impurities are likely to occur.

Next, a semiconductor device and its manufacture method according to a second embodiment of the invention will be described with reference to FIGS. 3A to 3M.

The semiconductor device manufacture method of the second embodiment is characterized in that a dummy gate electrode is used during intermediate processes among the processes of manufacturing a high speed transistor.

Figure 3A:
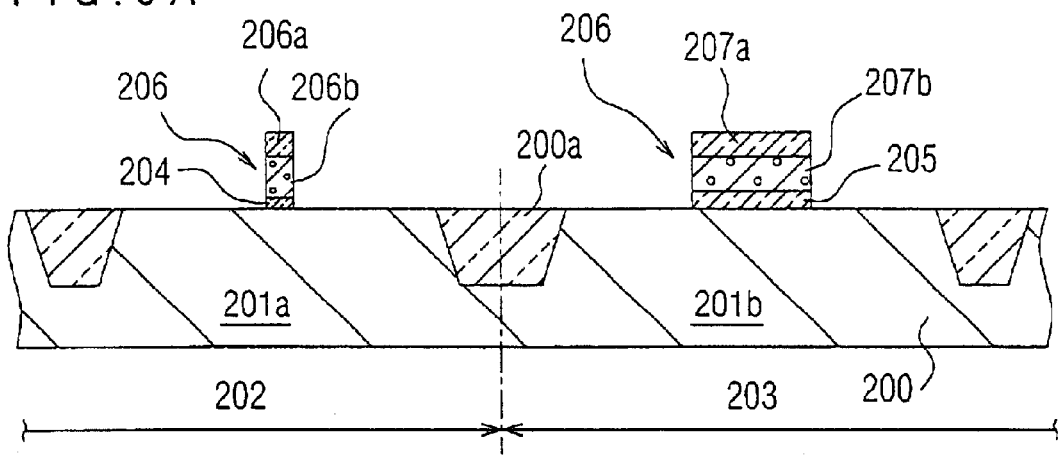
FIGS. 3A to 3M are cross sectional views illustrating a semiconductor device manufacturing method according to a second embodiment of the invention.

As shown in FIG. 3A, first and second element regions 202 and 203 are defined in a silicon substrate 200 by an element separation region 200a. In the first element region, high speed transistors are mainly formed, and in the second element region, high voltage transistors are mainly formed. Semiconductor layers 201a and 201b having a p-type conductivity are formed in the surface layers of the first and second element regions 202 and 203. A dummy gate electrode 206 is formed in the first element region 202 and a gate electrode 207 is formed in the second element region. The dummy gate electrode 206 and gate electrode 207 have substantially the same layer structure. The dummy gate electrode 206 is removed at a later process and replaced by a true gate electrode. From this reason, it is called a dummy gate electrode.

The dummy gate electrode 206 is constituted of a polysilicon layer 206b of 150 nm in thickness formed on a gate insulating film 204, and a silicon oxide film 206a of 50 nm in thickness formed on the gate insulating film by CVD. The silicon oxide film 206a is used for preventing silicidation. The gate electrode 207 is constituted of a polysilicon layer 207b of 150 nm in thickness formed on a gate insulating film 205, and a silicon oxide film 207a of 50 nm in thickness formed on the gate insulating film by CVD. The silicon oxide film 207a is used for preventing silicidation.

The processes shown in FIGS. 3B to 3H are approximately similar to those shown in FIGS. 1B to 1H, and the description thereof is omitted.

Figure 3B:
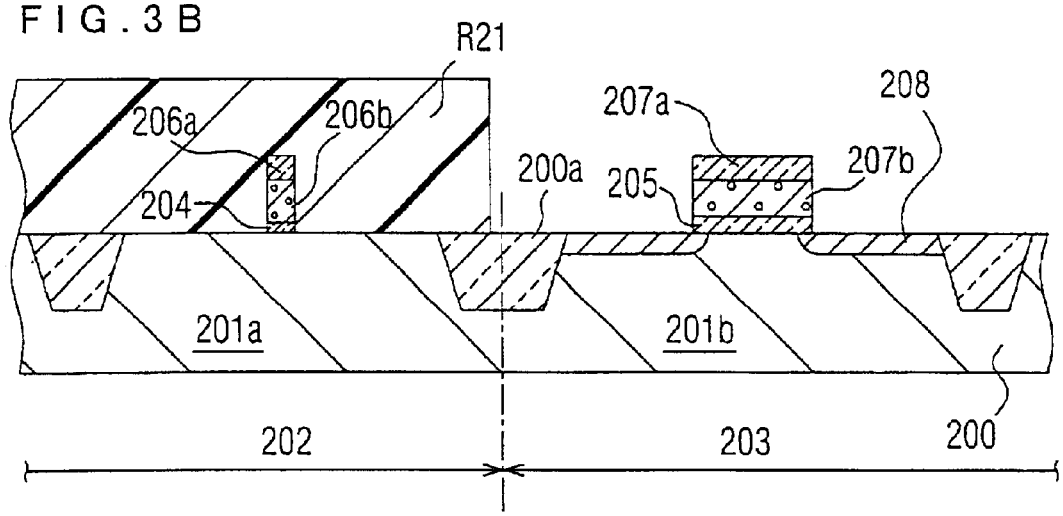
Figure 3C:
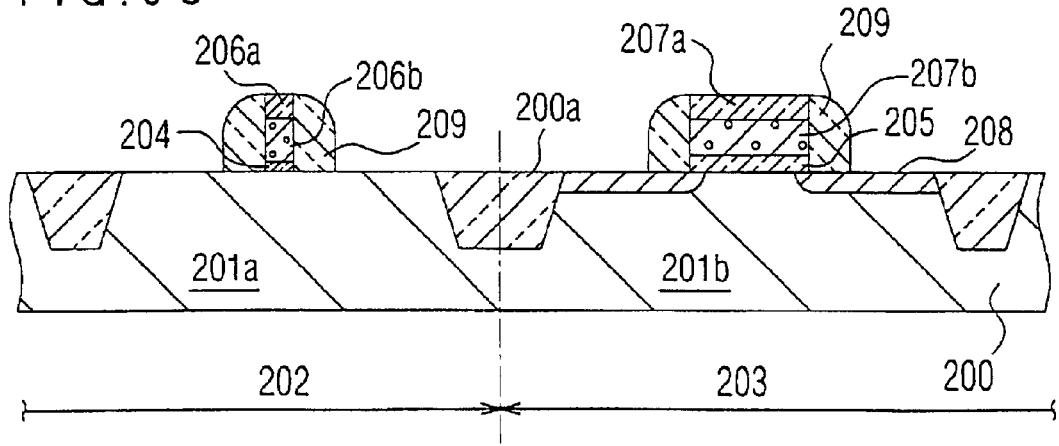
Figure 3D:
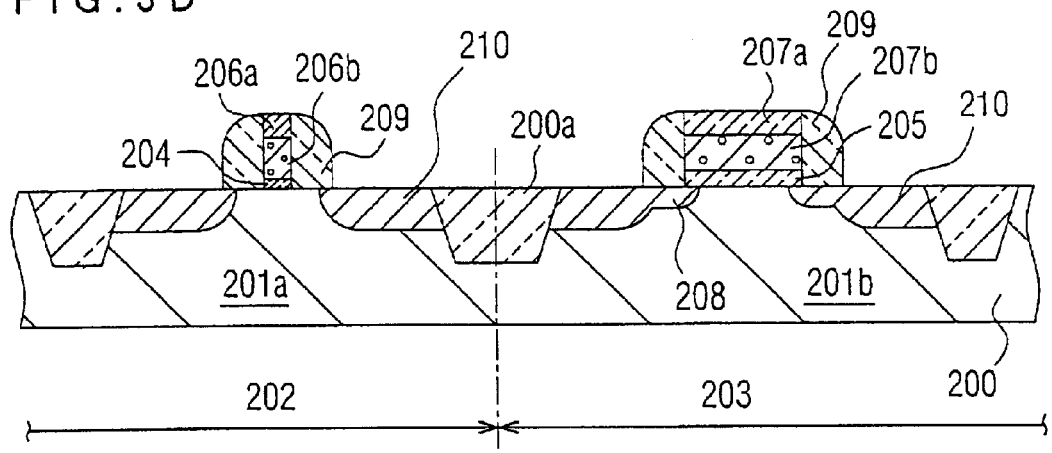
Figure 3E:
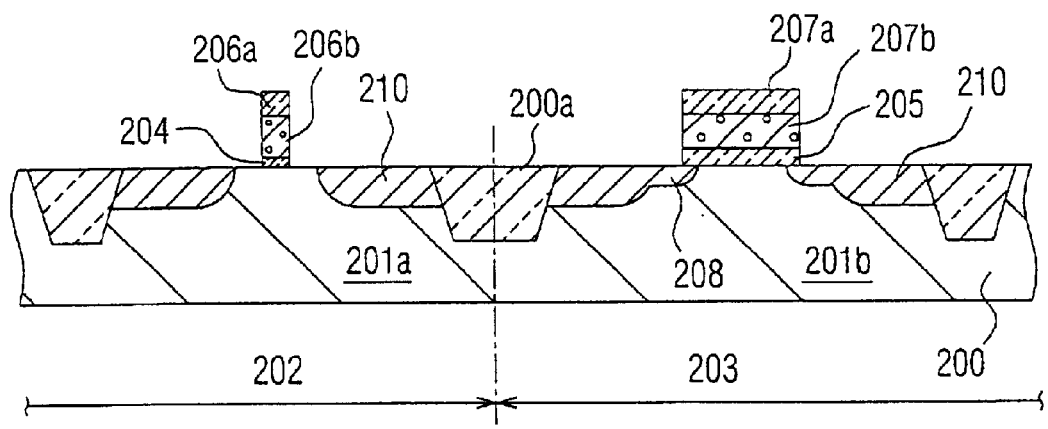
Figure 3F:
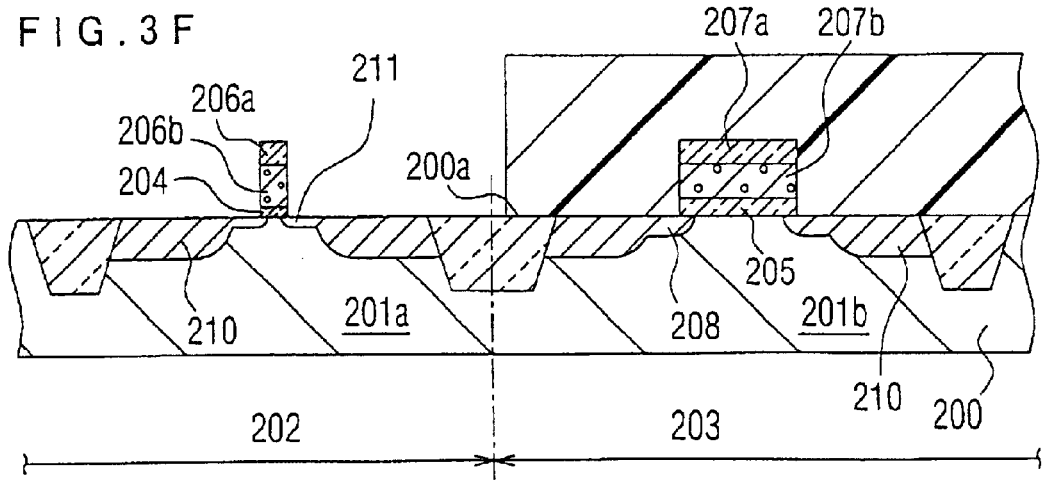
Figure 3G:
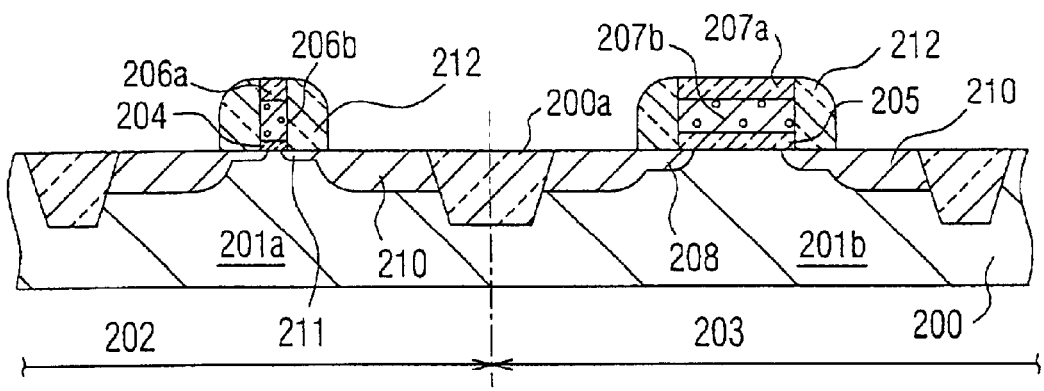

In the process shown in FIG. 3B, a first impurity diffusion region (SDE region) 208 is formed. In the process shown in FIG. 3C, spacer films 209 are formed on the side surface of the gate electrode. In the process shown in FIG. 3D, source/drain regions 210 are formed. In the process shown in FIG. 3E, the spacer films are removed. In the process shown in FIG. 3F, after a resist mask is formed on the second element region, an ion implantation process is executed and then the resist mask is removed. Thereafter, an activation process is executed to form second impurity diffusion regions (SDE regions) 211. In the process shown in FIG. 3G, spacer films 212 are formed on the side surface of the gate electrode.

Figure 3H:
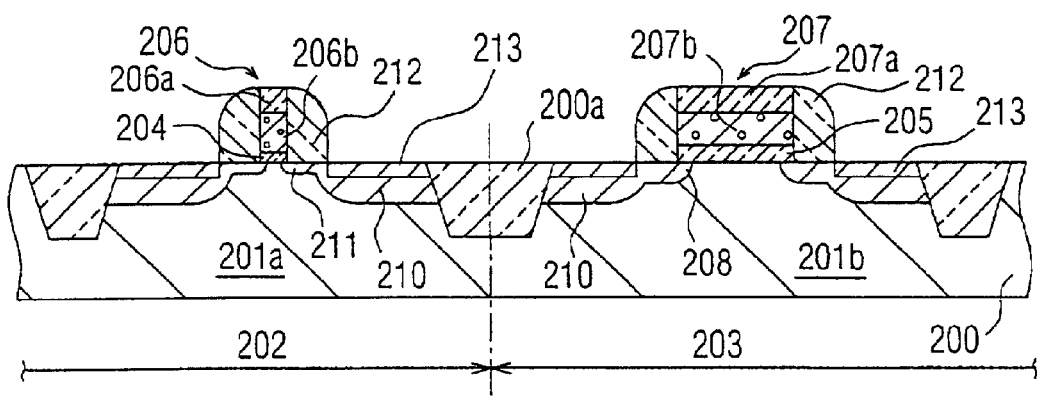

Thereafter, as shown in FIG. 3H, a high speed transistor having the dummy gate electrode 206 is formed in the first element region 202, whereas a high voltage transistor having the gate electrode 207 is formed in the second element region 203. At this time, the silicide preventing films 206a and 207a prevent the polysilicon gates 206b and 207b from being silicidated.

Figure 3I:
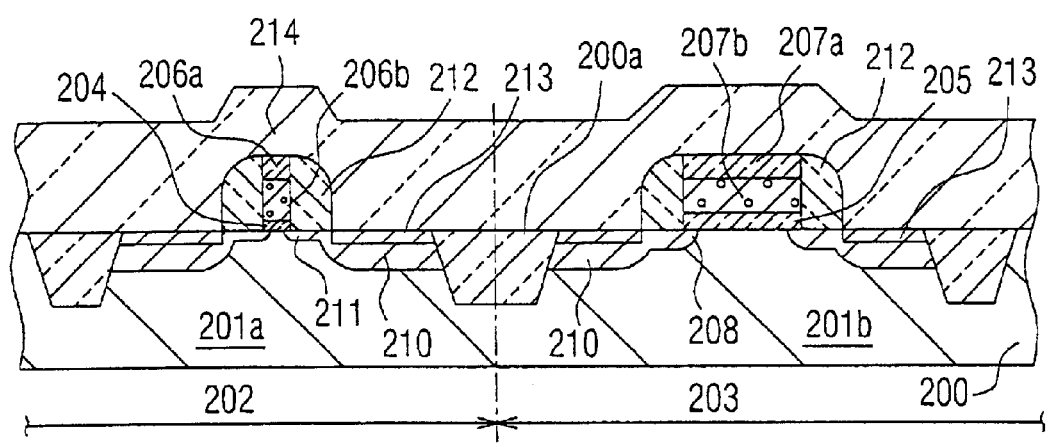
Figure 3J:
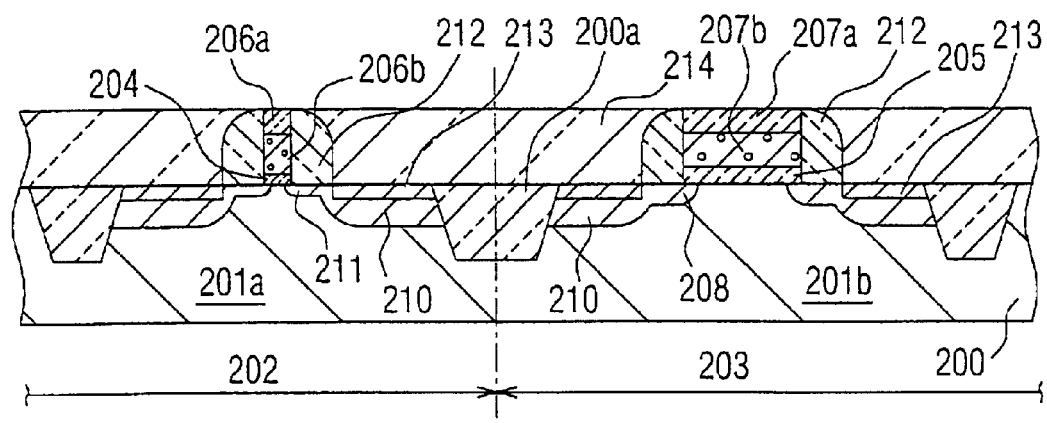

As shown in FIG. 3I, a silicon oxide film 214 of 750 nm in thickness is formed over the whole substrate surface using high density plasma CVD method. As shown in FIG. 8J, by using the upper surfaces of the spacer films 212 made of silicon nitride as an etching stopper, the upper surfaces 206a and 207a of the dummy gate electrode 206 and gate electrode 207 are exposed by chemical mechanical polishing (CMP).

Figure 3K:
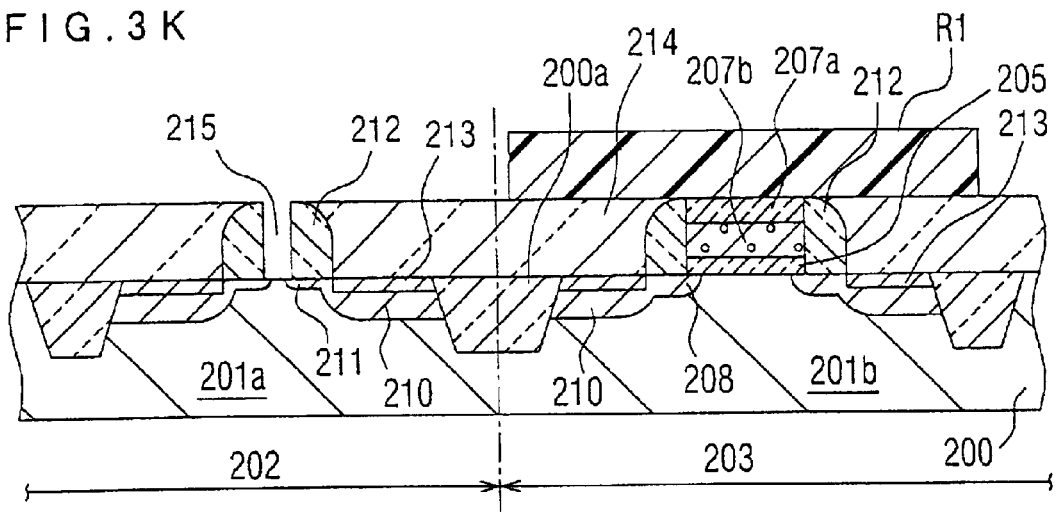

As shown in FIG. 3K, the second element region 203 is covered with a photoresist mask R1. The silicon oxide film 206a (FIG. 3J) constituting the dummy gate electrode 206 (FIG. 3J) is wet-etched by using etchant of fluorine acid. Next, the polysilicon layer 206b (FIG. 3J) is removed by CDE. Next, the gate oxide film 204 (FIG. 3J) is wet-etched by using etchant of fluorine acid. An opening 215 is therefore formed in the spacer film 212 in which the dummy gate electrode was formed.

Figure 3L:
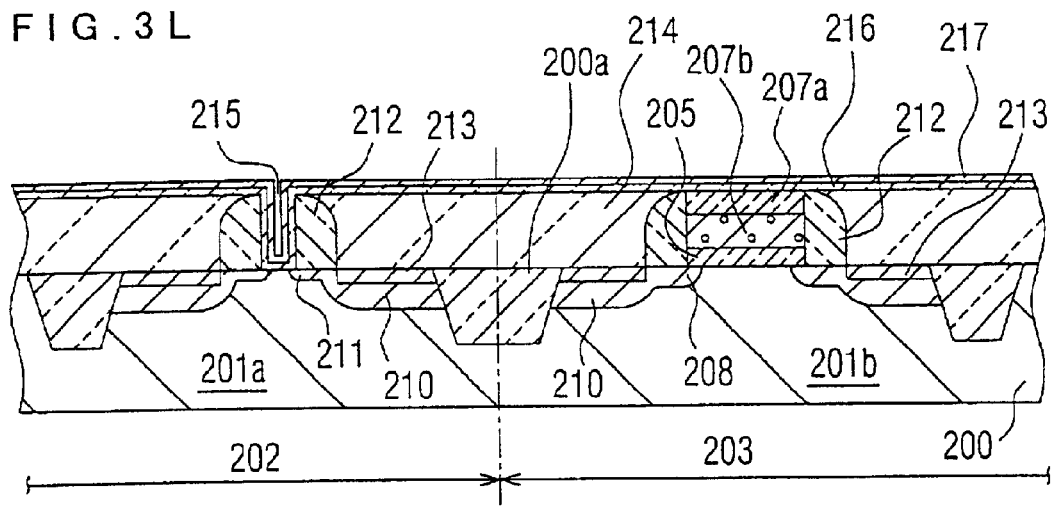

As shown in FIG. 3L, a high dielectric insulating film 216 of 15 nm in thickness made of, e.g., $HfO_2$ and a barrier metal layer 217 of 30 nm in thickness made of, e.g., TiN are formed over the whole surface of the silicon substrate 200. The inner surface of the opening 215 is therefore covered with the high dielectric insulating film 216 and barrier metal 217.

Figure 3M:
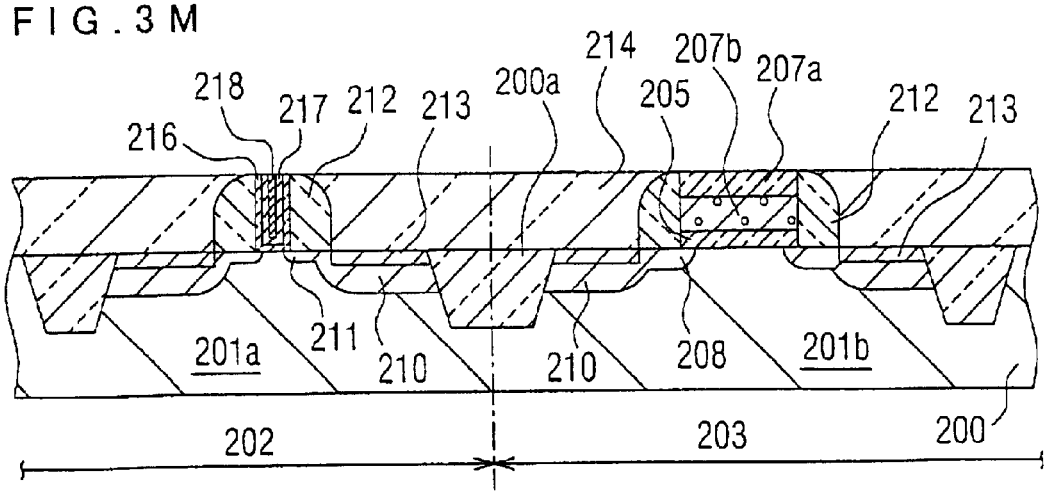

A burying metal layer 218 such as a W film is deposited on the substrate and then a planarizing process is executed by CMP. The burying metal film 218 may be made of the same material as the barrier metal layer 217. As shown in FIG. 3M, the opening 215 is filled in with the high dielectric insulating film 216 and metal layers 217 and 218. A true gate electrode is thus formed.

With the above-described processes, the high dielectric insulating film ($HfO_2$ or the like) can be used as the gate insulating film of a high speed transistor having a short gate length. Therefore, even if the gate insulating film is made thin in correspondence with a short gate length, leak current of the gate to be caused by tunneling current can be suppressed.

The gate electrode substitution process is not applied to the high voltage transistor, but the polysilicon gate electrode initially formed is left. A high voltage transistor can therefore be manufactured stably.

In the state shown in FIG. 3K, without forming the resist mask R1 on the second element region 203, the gate electrode of the high voltage transistor may be replaced by the electrode similar to that of the high speed transistor.

In this embodiment, the silicidation preventing films 206a and 207a may be made of silicon nitride ($SiN_x$) and the second spacer film 212 may be made of silicon oxide. In this case, the dummy gate electrode is removed by using both fluorine acid and CDE.

Next, a semiconductor device and its manufacture method according to a modification of the second embodiment of the invention will be described with reference to FIGS. 4A to 4F. The process conditions and the like are generally similar to those of the second embodiment. Similar constituent elements to those of the second embodiment are represented by using identical reference numerals and the detailed description thereof is omitted.

Figure 4A:
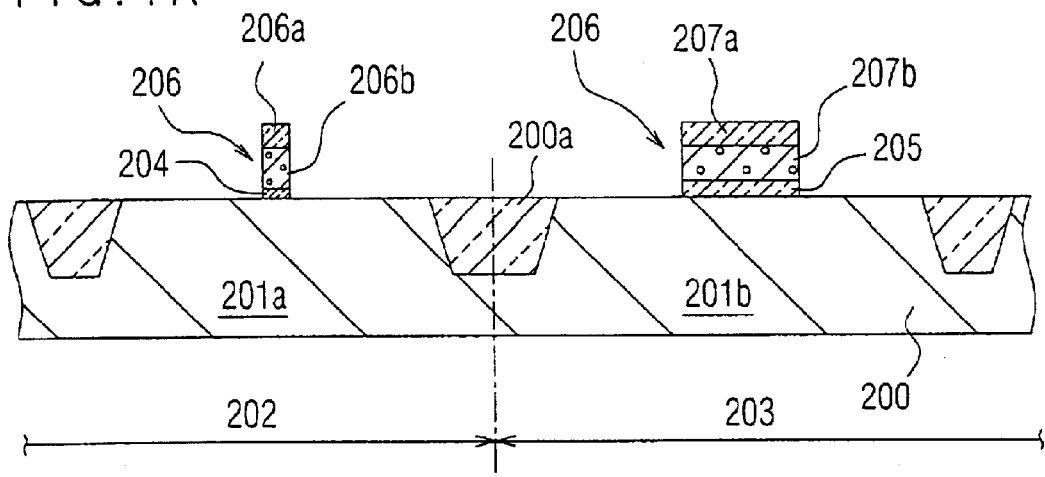
FIGS. 4A to 4F are cross sectional views illustrating a semiconductor device manufacturing method according to a modification of the second embodiment of the invention.
Figure 4B:
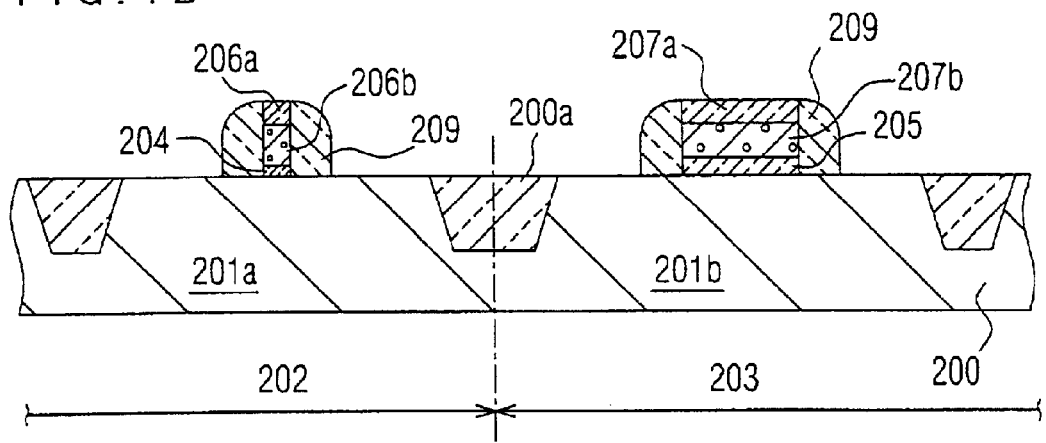

As shown in FIG. 4A, a first dummy gate electrode 206 is formed in a first element region 202 defined in a silicon substrate 200, and a second dummy gate electrode 207 is formed in a second element region 203. As shown in FIG. 4B, spacer films 209 are formed on the side surfaces of the first dummy gate electrode 206 and second gate electrodes 206 and 207.

Figure 4C:
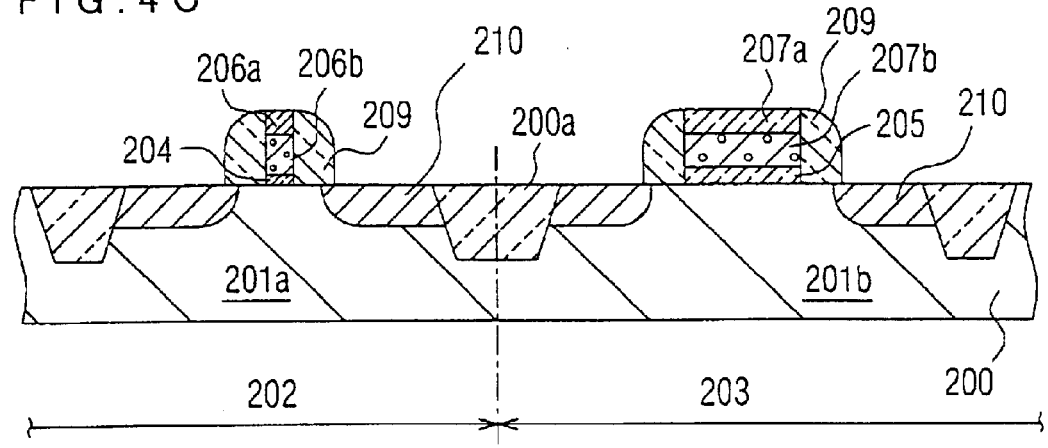

As shown in FIG. 4C, by using the first dummy gate electrode 206 and the second gate electrode 207 and spacer films 209 as a mask, an ion implantation process and an activation process are executed to form source/drain regions 210 on both sides of the gate electrodes.

Figure 4D:
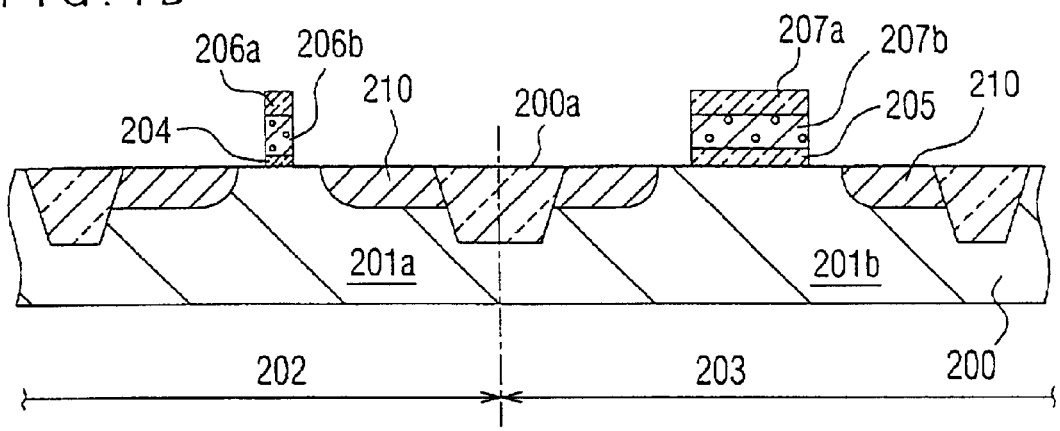
Figure 4E:
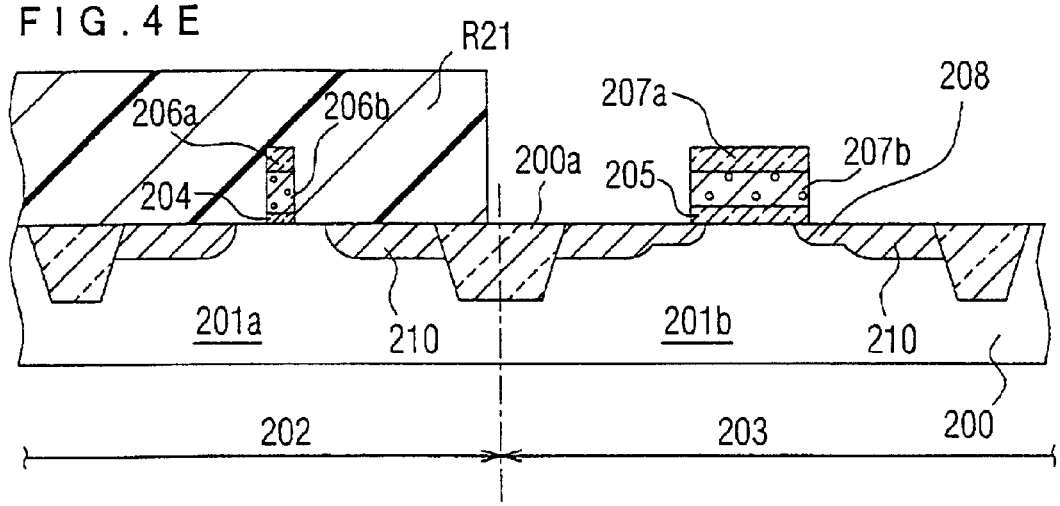
Figure 4F:
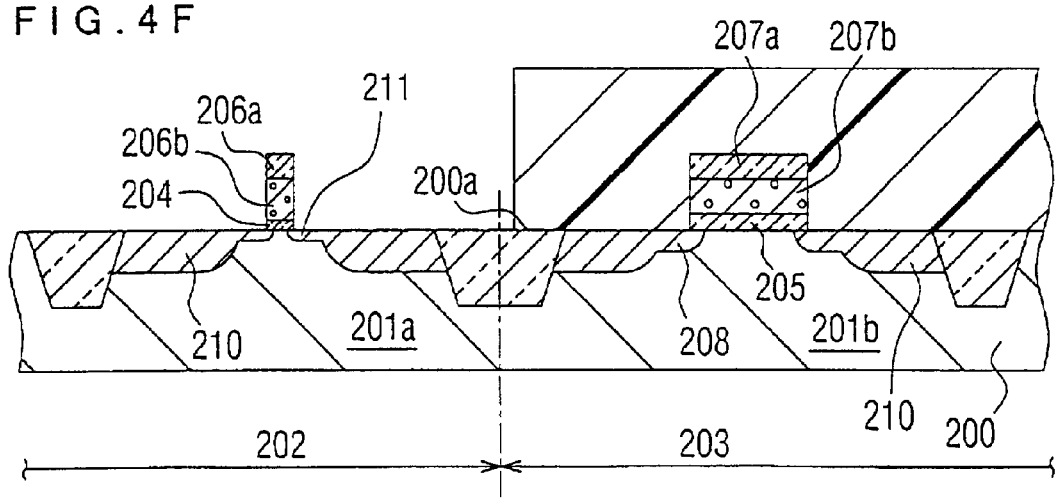

As shown in FIG. 4D, the space films 209 are removed. As shown in FIG. 4E, the first element region 202 is covered with a resist mask R21, and an ion implantation process and an activation process are performed for the second element region 203 to form first SDE regions 208. As shown in FIG. 4F, the second element region 203 is covered with a resist mask, and an ion implantation process and an activation process are performed for the first element region 202 to form second SDE regions 211.

Thereafter, processes similar to those described with reference to FIGS. 3G to 3M of the first embodiment are executed to complete the structure similar to that of the semiconductor device of the second embodiment.

With the above-described processes, the high dielectric insulating film ($HfO_2$ or the like) can be used as the gate insulating film of a high speed transistor having a short gate length. Therefore, even if the gate insulating film is made thin in correspondence with a short gate length, leak current of the gate to be caused by tunneling current can be suppressed.

The gate electrode substitution process is not applied to the high voltage transistor, but the polysilicon gate electrode initially formed is left. A high voltage transistor can therefore be manufactured stably.

Next, a semiconductor device and its manufacture method according to a third embodiment of the invention will be described with reference to FIGS. 5A to 5H.

Also in the third embodiment of the semiconductor device and its manufacture method, a first element region 302 and a second element region 303 are defined in a silicon substrate 300 by an element separation region 300a. Regions 301a and 301b are formed in the surface layer of the substrate 300, the regions 301a and 301b having different impurity concentrations of p-type conductivity.

According to the semiconductor manufacture techniques of this embodiment, in the first element region 302, high speed transistors are mainly formed, and in the second element region 303, resistor elements using an impurity diffusion region as a resistor layer are mainly formed.

Figure 5A:
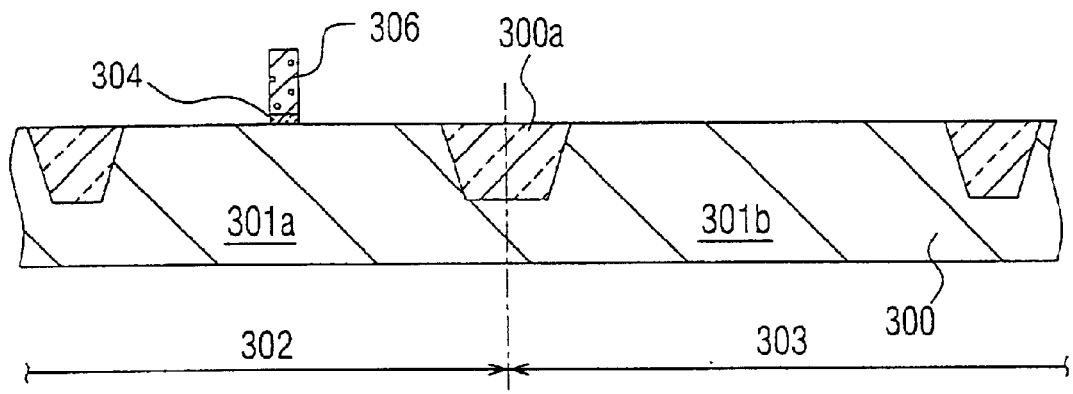
FIGS. 5A to 5F are cross sectional views illustrating a semiconductor device manufacturing method according to a third embodiment of the invention.

As shown in FIG. 5A, a gate insulating film 304 and a first gate electrode 306 are formed on the first element region 302.

Figure 5B:
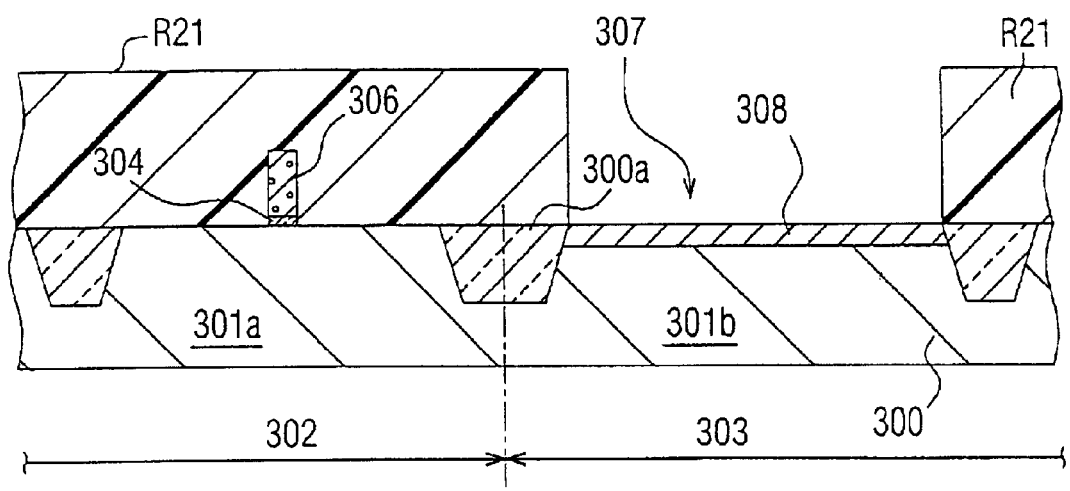

As shown in FIG. 5B, the first element region 302 is covered with a photoresist mask R21 which has an opening 307 in the second element region 303. By using the photoresist mask R21 as a mask, an impurity diffusion layer 308 is formed in the surface layer 301b of the semiconductor substrate 300 exposed in the opening 307. The impurity diffusion layer 308 is formed by ion implantation, for example, by implanting P ions at an acceleration energy of 20 keV and a dosage of $4 \times 10^{13}$ $cm^{-2}$. Thereafter, the photoresist mask R21 is removed. Next, an activation process is executed for ten seconds at 1000° C. by using RTA. A resistance layer for a resistor element is thus formed.

After the photoresist mask R21 is removed, a silicon oxide film is formed over the whole surface of the silicon substrate 300. A second element region 303 is covered with a photoresist mask by photolithography. The silicon oxide layer is anisotropically etched.

Figure 5C:
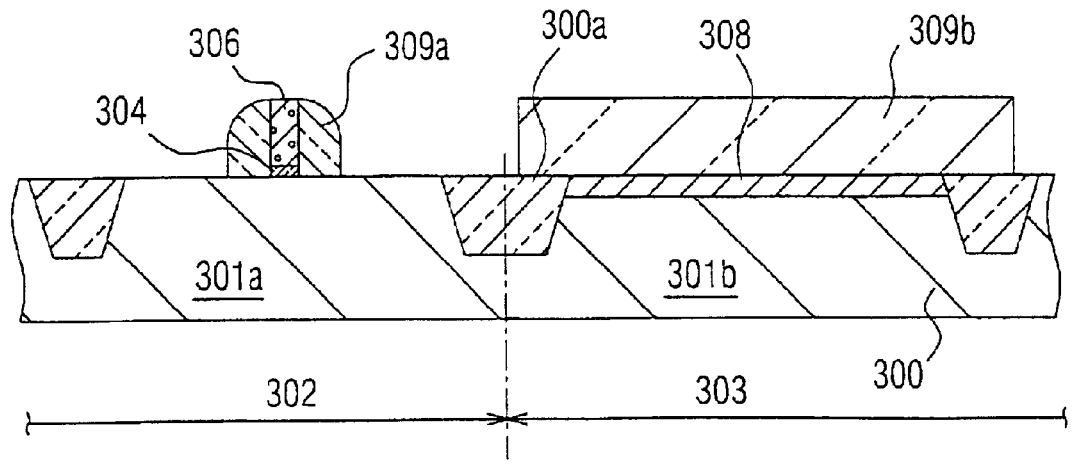

As shown in FIG. 5C, a silicon oxide layer 309b is therefore left on the second element region 303. At the same time, spacer films 309a of silicon oxide are also left on the side surfaces of the gate electrode 306 formed in the first element region 302.

Figure 5D:
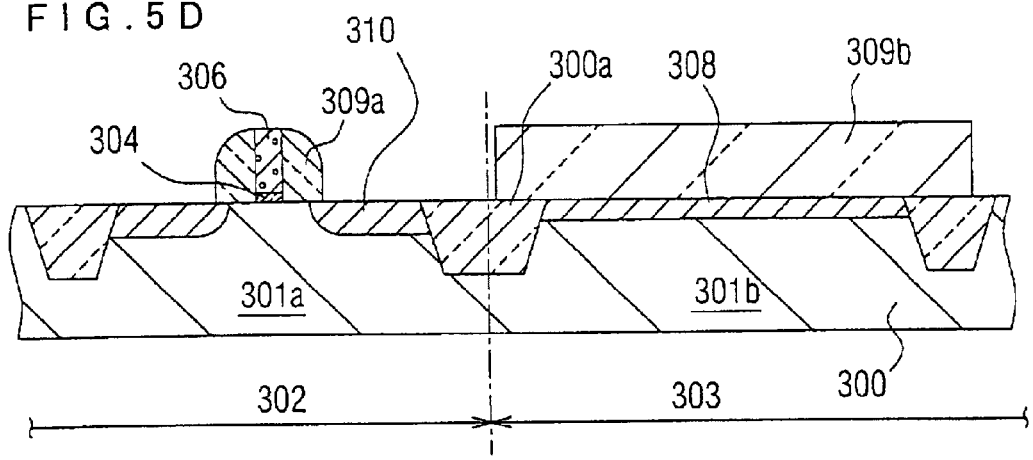

As shown in FIG. 5D, by using the silicon oxide layer 309b, gate electrode 306 and spacer films 309a as a mask, an ion implantation process is executed to form source/drain regions. In this case, the silicon oxide layer 309b prevents ions from entering the second element region. The source/drain regions are formed by implanting P ions under the conditions of an acceleration energy of 30 keV and a dosage of $2 \times 10^{15}$ $cm^{-2}$. Next, an activation process is executed, for example, for three seconds at 1025° C. by RTA.

Next, the spacer films 309a and silicon oxide layer 309b are removed.

Figure 5E:
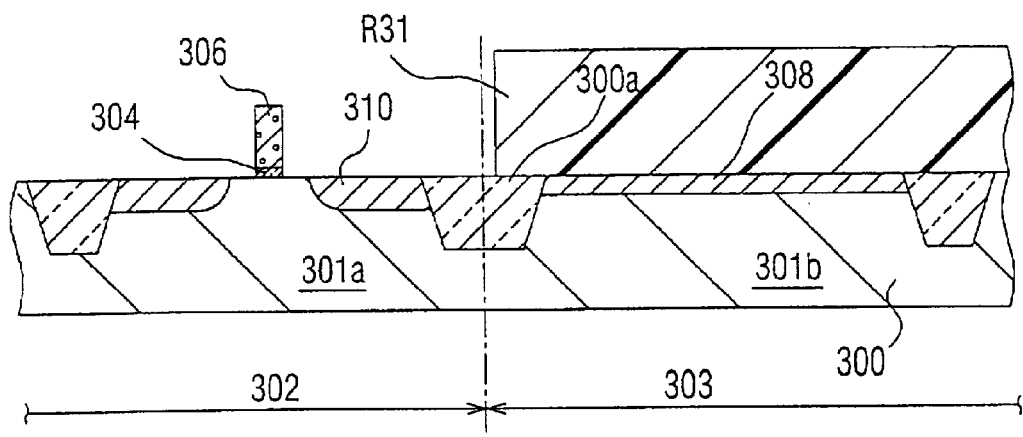

As shown in FIG. 5E, the second element region 303 is covered with a photoresist mask R31. In this state, an ion implantation process is executed for forming SDE regions. For example, As (arsenic) ions are implanted at an acceleration energy of 5 keV and a dosage of $1 \times 10^{15}$ $cm^{-2}$. The resist mask R31 is thereafter removed.

Next, an activation process is executed for activating As ions. This activation process is executed by using LTP under the same conditions as those of the activation process for the third impurity diffusion regions (SDE regions) 111 of the first embodiment.

Figure 5F:
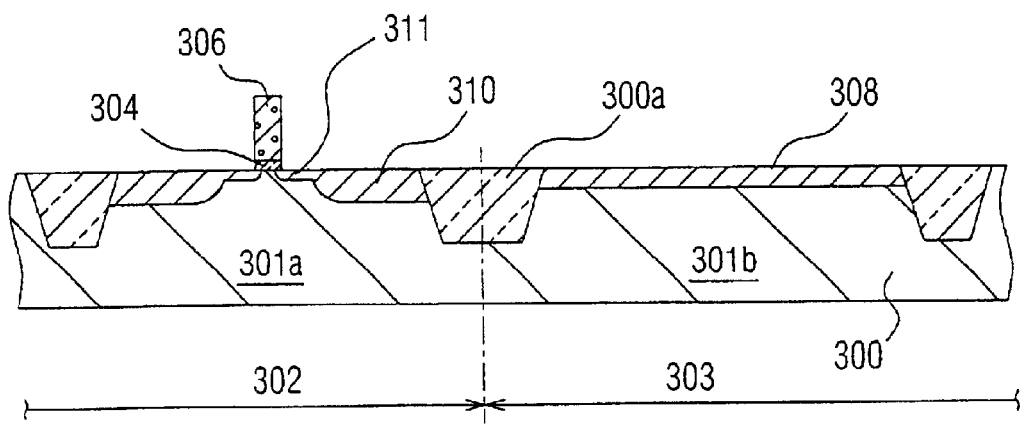

As shown in FIG. 5F, SDE regions 311 are therefore formed on both sides of the gate electrode 306, the SDE regions 311 being connected to the source/drain regions 310.

A silicon nitride film is formed over the whole surface of the silicon substrate 300. After the second element region 303 is covered with photoresist, the silicon nitride film is anisotropically etched.

Figure 5G:
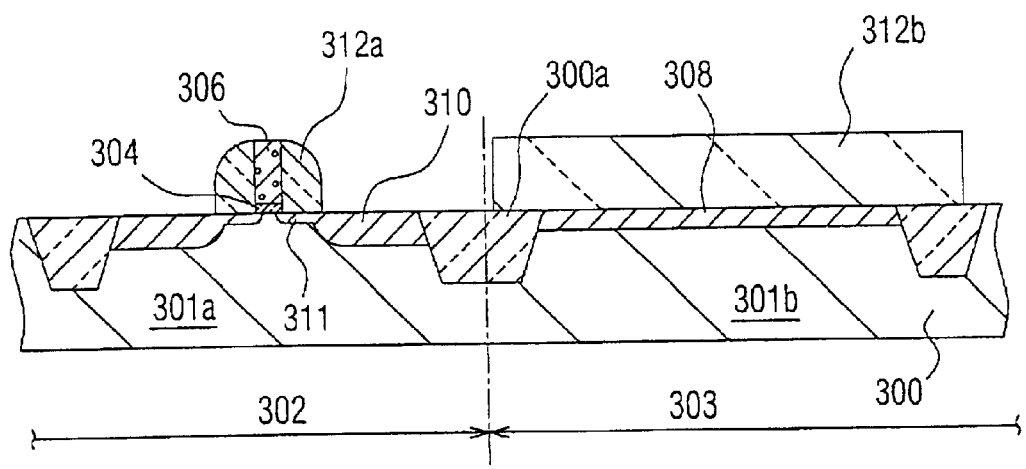

As shown in FIG. 5G, in the first element region 302, spacer layers 312a are therefore formed on the side surfaces of the gate electrode 306 of the transistor. The photoresist mask is thereafter removed. A silicidation preventing film 312b is formed on the second element region 303 to cover the surface of the resistor layer 308 in the second element region 303.

A metal layer of Co or the like is formed over the whole surface of the silicon substrate 300. A heat treatment for silicidation is executed to form a $CoSi_2$ layer on the source/drain regions 310 and gate electrode 306. An unreacted Co metal layer on the spacer films 312a is removed. An unreacted Co metal layer on the second element region is also removed.

Figure 5H:
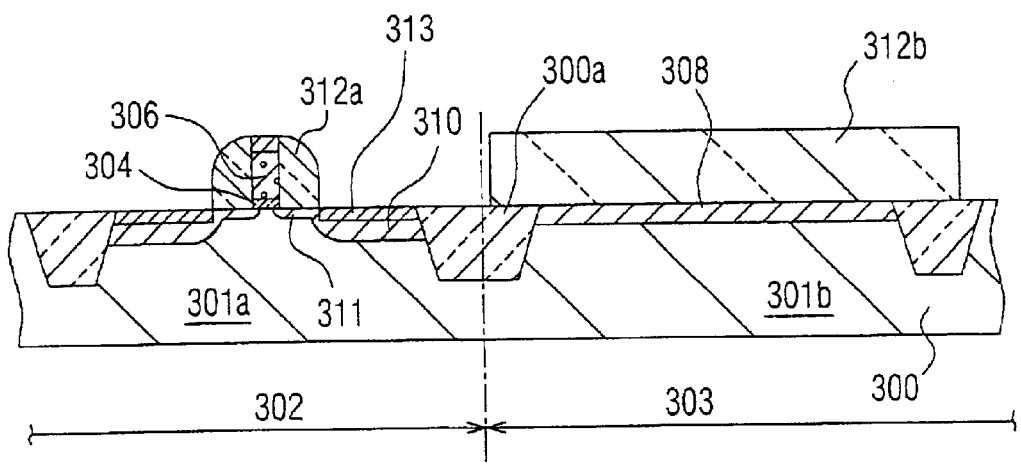

As shown in FIG. 5H, a high speed transistor is therefore formed in the first element region 302, and a resistor element 308a is formed in the second element region 303. The resistor element 308a is not silicidated during the silicidation process because of the presence of the silicidation preventing film 312b. Ions used for forming the SDE regions are implanted into the resistor element 308a.

In this embodiment, after the impurity diffusion region for the resistor element is first formed, the source/drain regions are formed and then the SDE regions are formed. Instead, the source/drain regions may be formed first, thereafter the resistor element is formed, and lastly the SDE regions are formed.

In the first to third embodiments described above, n-type MOS transistors and n-type resistor elements are manufactured by way of example. It is obvious that p-type MOS transistors and p-type resistor elements may also be manufactured by similar methods. It is also possible to form both n- and p-type elements on the same substrate.

The semiconductor device manufacture techniques of the embodiments may be applied to a CMOS integrated circuit having p-type and n-type MOSFETs.

Next, a semiconductor device and its manufacture method according to a modification of the third embodiment of the invention will be described with reference to FIGS. 6A to 6J.

A 2-step activated anneal process (2-step AAP) is known as a MOSFET manufacture method. The 2-step AAP is made well known in K. Goto et al., International Electron Device Meeting, 1997. According to the 2-step AAP, side wall spacers are formed on the side walls of a MOSFET gate electrode, and thereafter ions are implanted to form source/drain regions of a low resistivity. In order to activate implanted ions, a first heat treatment is performed. The side spacers are removed before or after the first heat treatment. Thereafter, ions are implanted to form source/drain extension (SDE) regions. In order to activate implanted ions, a second heat treatment is performed. After side wall spacers are again formed, a self-aligned silicide (salicide) process is performed.

Similar to the third embodiment, transistors and resistor elements are formed on the same substrate in many cases by using the 2-step AAP. In the third embodiment, an impurity diffused region formed in the semiconductor substrate by ion implantation or the like is used as a resistor element. Another resistor forming method uses, as the material of a resistor element, material of a MOSFET gate electrode, mainly a polysilicon layer or polysilicon germanium layer given a conductivity. In adjusting the conductivity of a polysilicon layer, ions are implanted into the polysilicon layer when ion implantation for forming MOSFET source/drain regions is performed.

A silicide process for lowering the resistance is effective for MOSFET gate electrode material. However, if the polysilicon layer used as a resistor element is silicidated, the resistance becomes too low.

In the following, a semiconductor device manufacture method will be described which includes a process of forming a resistor element by using the same material as a gate electrode.

Figure 6A:
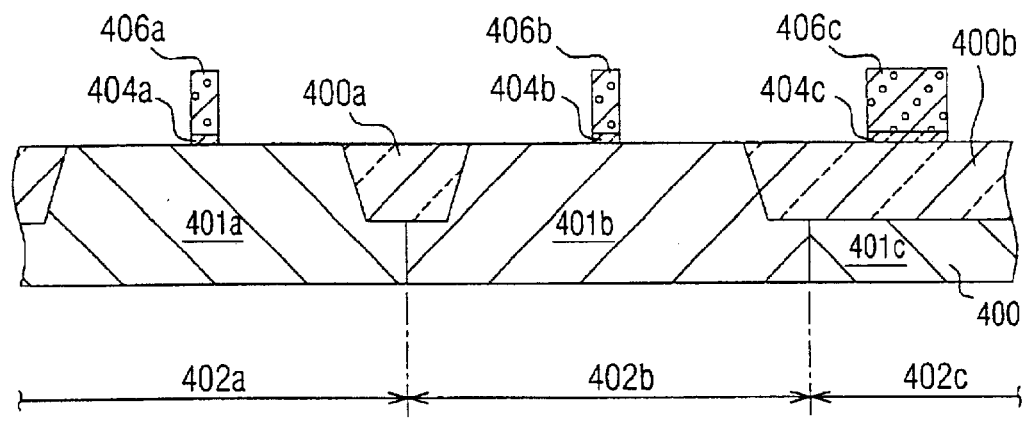
FIGS. 6A to 6J are cross sectional views illustrating a semiconductor device manufacturing method according to a modification of the third embodiment of the invention.

As shown in FIG. 6A, element separation regions 400a and 400b define first element regions 402a and 402b and a second element region 402c in a silicon substrate 400. Both the first element regions 402a and 402b are regions where high speed transistors are formed. Also in the modification of the third embodiment, the first element regions are considered as one integral element region. In the first element regions 402a and 402b, a p-type region 401a and an n-type region 401b having different conductivity types are formed in the surface layer of the substrate 400. In the second element region 402c, an element separation region 400b is formed by shallow trench isolation (STI) in the surface layer of the substrate 400.

Thereafter, on the surface of the substrate 400, for example, a silicon oxide film and a polysilicon film are deposited. The silicon oxide film may be formed by thermal oxidation. In this case, the silicon oxide film is not formed in the element separation regions 400a and 400b. The polysilicon film and silicon oxide film are anisotropically etched to form a gate insulating layer 404a and a gate electrode layer 406a in the first element region 402a and to form a gate insulating layer 404b and a gate electrode layer 406b in the second element region 402b. In the second element region 402c, a lamination structure of a silicon oxide layer 404c and a polysilicon layer 406c is formed. As described above, if the gate insulating layer is formed by thermal oxidation, the silicon oxide layer 404c does not exist.

Figure 6B:
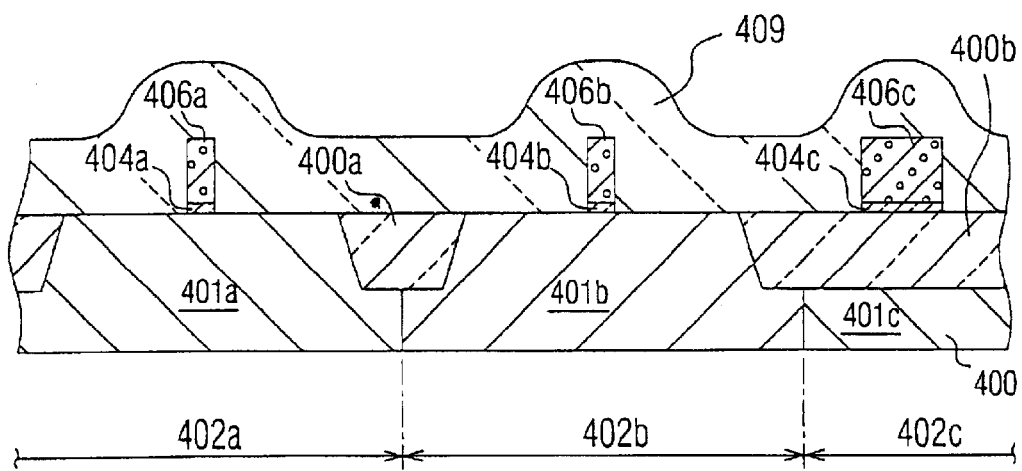
Figure 6C:
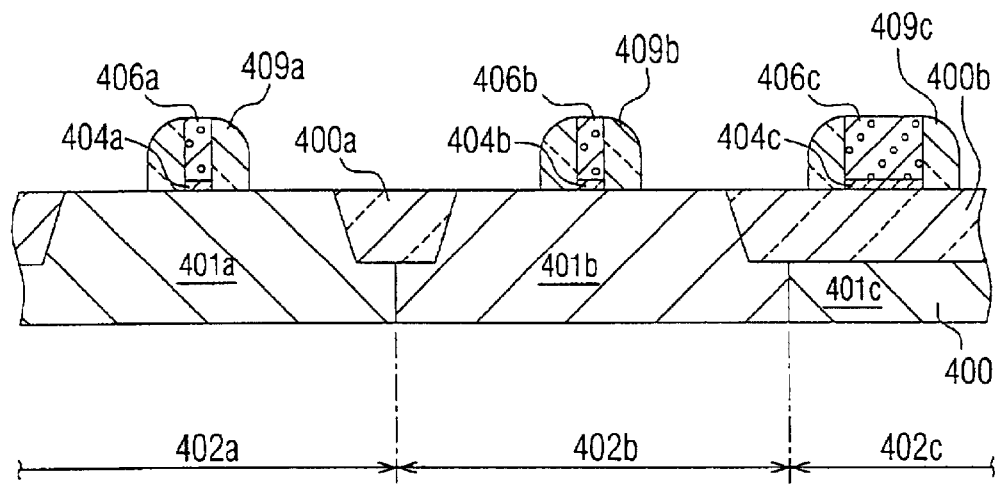
Figure 6D:
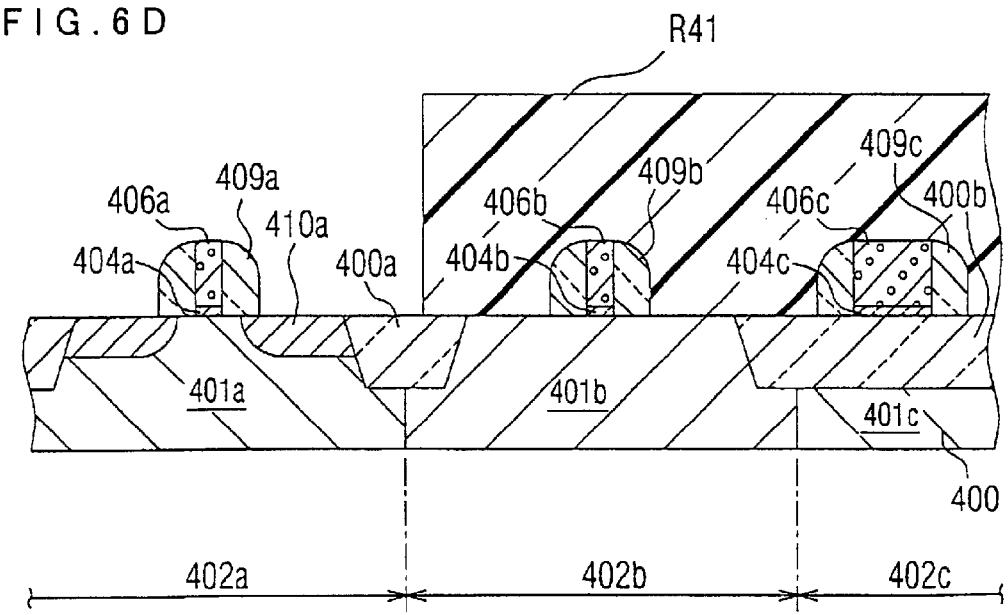

As shown in FIG. 6B, for example, a silicon nitride film 409 is deposited on the substrate 400, covering the gate electrodes and lamination structure. In this state, anisotropical etching such as reactive ion etching (RIE) is performed. As shown in FIG. 6C, side wall spacers 409a, 409b and 409c are formed on the side walls of the gate electrodes and lamination structure.

A resist mask R41 is formed by using photolithography techniques, the resist mask R41 covering the second element region 402c and one 402b of the first element regions (hereinafter called a PMOS region 402b) and having an opening in the other 402a of the first element regions (hereinafter called an NMOS region 402a). Next, As ions are implanted into the NMOS region 402a under the conditions of an acceleration energy of 30 keV and a dose of $5 \times 10^{15}$ $cm^{-2}$. If ion implantation is performed by leaving a silicon oxide film on the substrate 400, for example, by about 15 nm in thickness, the acceleration energy is raised to 40 keV to perform ion implantation. Next, the resist mask R41 is removed.

Figure 6E:
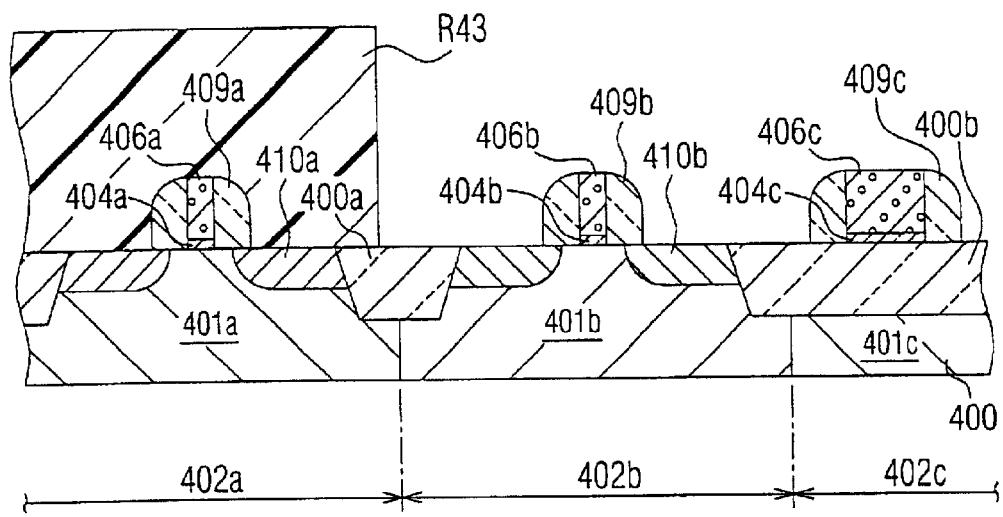

As shown in FIG. 6E, a resist mask R43 is formed covering the NMOS region 402a and having an opening in the PMOS region 402b and second element region 402c. By using the resist mask R43, B ions are implanted under the conditions of an acceleration energy of 5 keV and a dose of $4\times10^{15}$ cm$^{-2}$. If ion implantation is performed by leaving a silicon oxide film on the substrate 400, for example, by about 15 nm in thickness, the acceleration energy is raised to 7 keV to perform ion implantation. B ions are therefore implanted into the regions where the source/drain regions are formed in the PMOS region 402b and into the polysilicon layer 406c to be used as a resistor element. Since the ion implantation is performed at the same time both for the source/drain regions in the PMOS region 402b and the resistor element polysilicon layer 406c, another ion implantation process for the resistor element is not necessary. In this process, although the ion implantation is performed at the same time both for the source/drain regions in the PMOS region 402b and the resistor element polysilicon layer 406c, an ion implantation process for the source/drain regions in the NMOS region 402a and the resistor element may be performed.

Next, the resist mask R43 is removed. Heat treatment is performed to activate ions implanted into the substrate and polysilicon layer. For example, heat treatment is performed at 1050° C. for 3 seconds by RTA. Thereafter, the side wall spacers 409a, 409b and 409c (FIG. 6E) are removed.

Figure 6F:
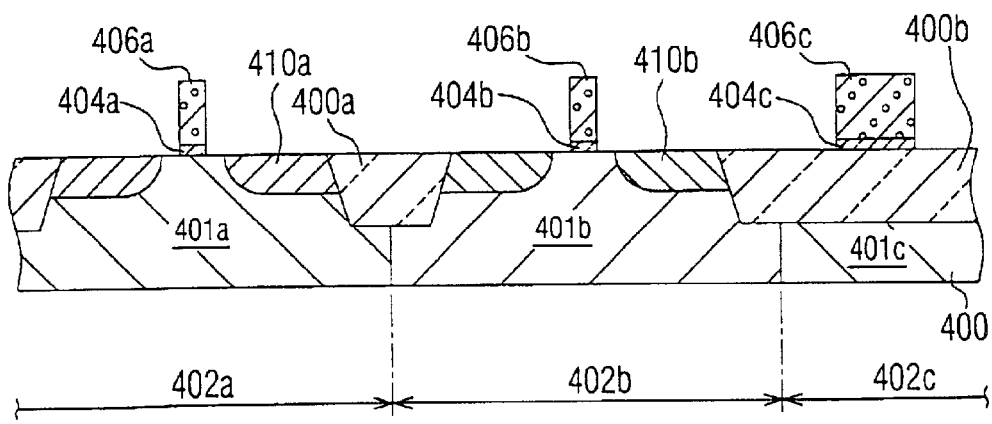

As shown in FIG. 6F, the source/drain regions 410a and 410b are therefore formed in the first element regions 402a and 402b and the resistance element polysilicon layer 406c has a low resistance.

In the above processes, silicon nitride is used as the material of the side wall spacer and silicon oxide (having different etching characteristics from silicon nitride) is used as the material filled in the element separation region. Therefore, the side wall spacers can be removed selectively relative to the silicon oxide in the element separation region.

Figure 6G:
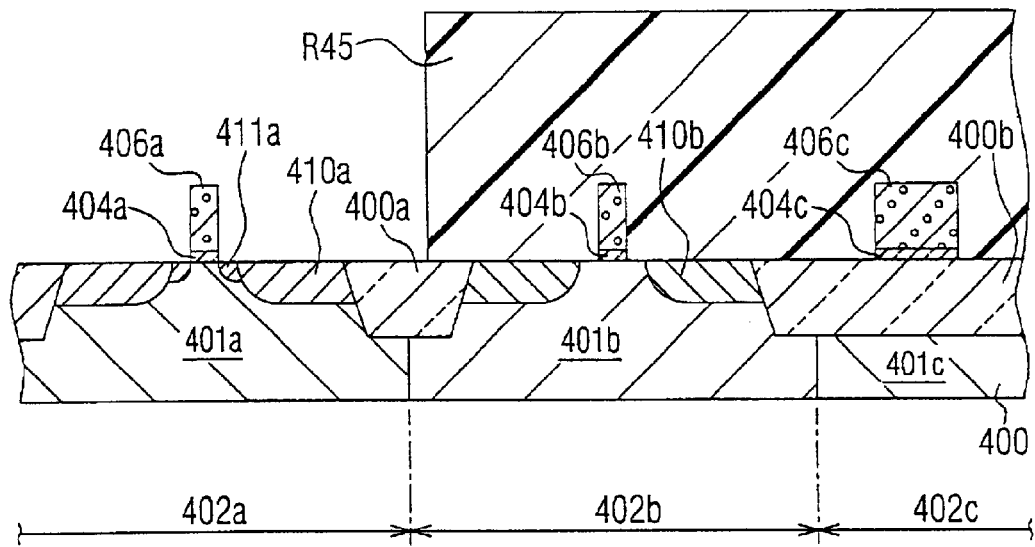

As shown in FIG. 6G, a resist mask R45 is formed over the substrate, the resist mask R45 covering the PMOS region 402b and second element region 402c and having an opening in the NMOS region 402a. By using the resist mask R45 and gate electrode as a mask, ions are implanted into the NMOS region 402a to form SDE. For example, this ion implantation is performed by using As ions under the conditions of an acceleration energy of 5 keV and a dose of $1\times10^{15}$ cm$^{-2}$. The resist mask R45 is thereafter removed.

Figure 6H:
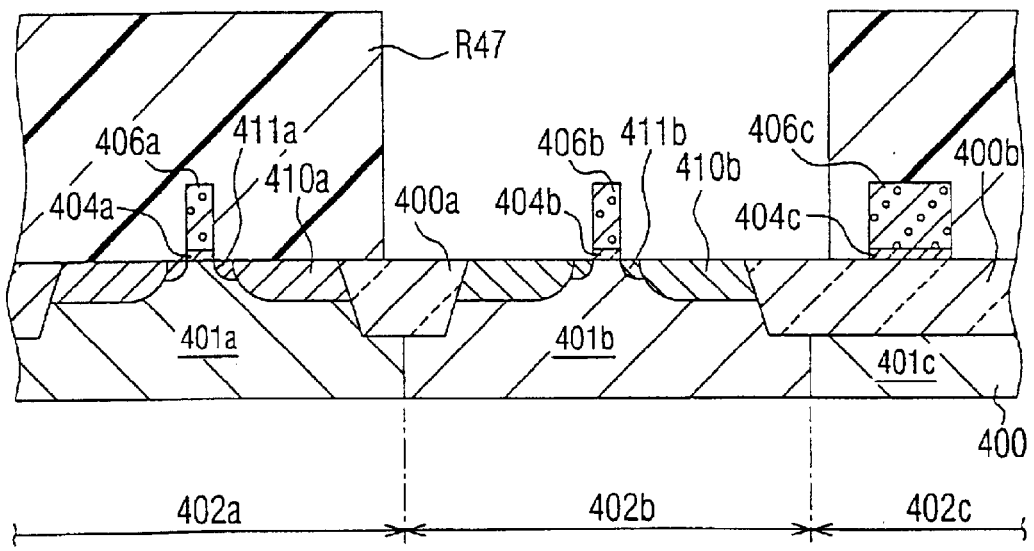

Next, as shown in FIG. 6H, a resist mask R47 is formed over the substrate, the resist mask R47 covering the NMOS region 402a and second element region 402c and having an opening in the PMOS region 402b. By using the resist mask R47 and gate electrode as a mask, ions are implanted into the PMOS region 402b to form SDE. For example, this ion implantation is performed by using B ions under the conditions of an acceleration energy of 0.5 keV and a dose of $1\times10^{14}$ cm$^{-2}$. After the resist mask R47 is removed, heat treatment is performed to activate ions implanted for SDE. For example, the heat treatment is performed at 1000° C. for 3 seconds by RTA.

Thereafter, an insulating film for forming side wall spacers, e.g., a silicon nitride film, is deposited on the substrate. After the second element region 402c is covered with a resist mask R48, the insulating film is anisotropically etched.

Figure 6I:
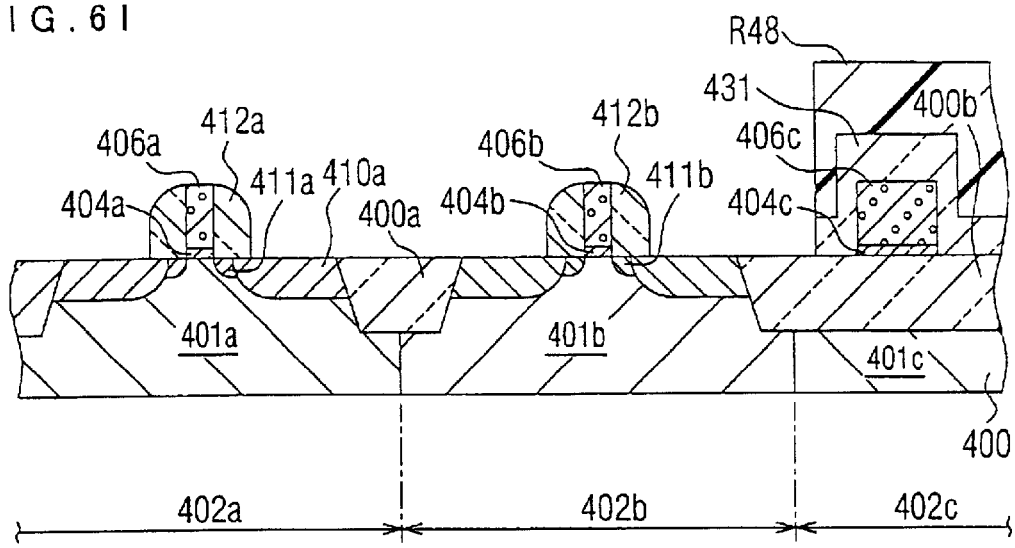

As shown in FIG. 6I, side wall spacers 412a and 412b are therefore formed on the side walls of the gate electrode in the NMOS region 402a and the gate electrode in the PMOS region 402b. A protective film 431 of silicon nitride is therefore formed over the second element region 402c. The resist mask R48 is removed.

Figure 6J:
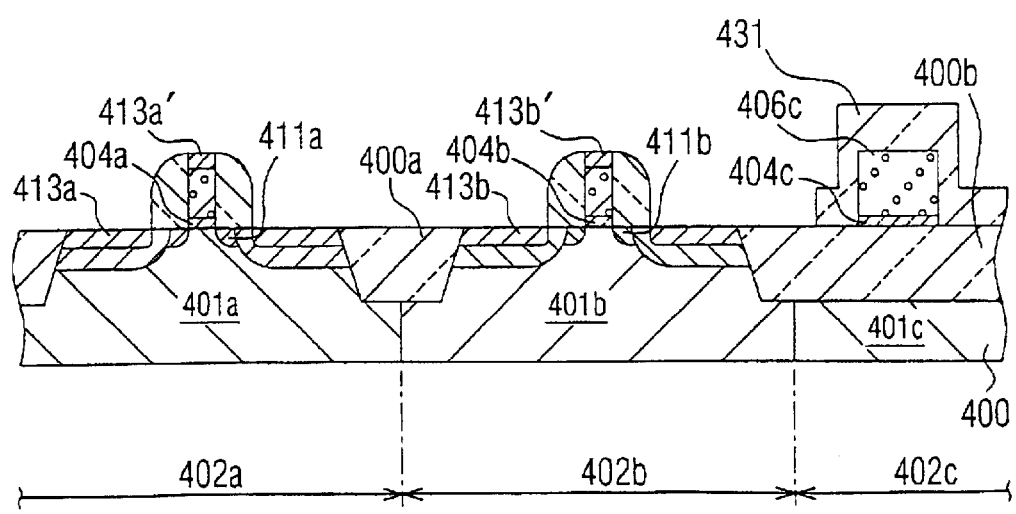

As shown in FIG. 6J, a salicide (self-aligned silicide) process is performed. For example, a Co metal film is deposited over the substrate and heat treatment is performed under predetermined conditions. In the regions where the Co metal layer directly contacts the polysilicon layer or silicon semiconductor layer, a metal silicide (CoSi$_2$) layer is formed. An unreacted Co layer deposited on the side wall spacers and protective film 431 is selectively removed by using, for example, hydrofluoric acid containing etchant. A two-step silicide process may be performed wherein after a first silicide process is performed, unreacted metal is washed out and then a second suicide process is performed. With the above processes, the suicide layer is formed on the gate electrode and source/drain regions of each transistor, whereas it is not formed on the polysilicon layer constituting the resistor element. It is therefore possible to prevent the resistor element from having too low a resistance.

Thereafter, wiring patterns between elements are formed by a well-known process of forming interlayer insulating films and wiring patterns, to complete an integrated circuit.

In the above processes, the ion implantation process for the source/drain regions in the NMOS region is performed first, and then the ion implantation process for the source/drain regions in the PMOS region is performed. The order of ion implantation may be reversed. The order of ion implantation for SDE may also be reversed for the PMOS and NMOS regions.

According to the techniques of the third embodiment, a resistor element is formed by ion implantation into a semiconductor substrate and by activation annealing. In this case, a new photolithography process is necessary. In contrast, according to semiconductor manufacture techniques of this modification, the ion implantation for forming transistor source/drain regions and the ion implantation for lowering the resistance of a polysilicon layer to be used as a resistor element can be performed by the same process. The manufacture processes can therefore be simplified. By forming a resistor element by polysilicon, a junction capacitance by a p-n junction formed in the substrate can be reduced.

There are semiconductor manufacture techniques of forming an electro-static discharge (ESD) resistant MOSFET which can be protected from electrostatic breakdown.

An ESD resistant MOSFET is required to have the structure that a portion of the drain region is not silicidated. With reference to FIG. 7 and FIGS. 8A to 8J, techniques of manufacturing a semiconductor integrated circuit including ESD resistant MOSFET's according to the fourth embodiment of the invention will be described.

Figure 7:
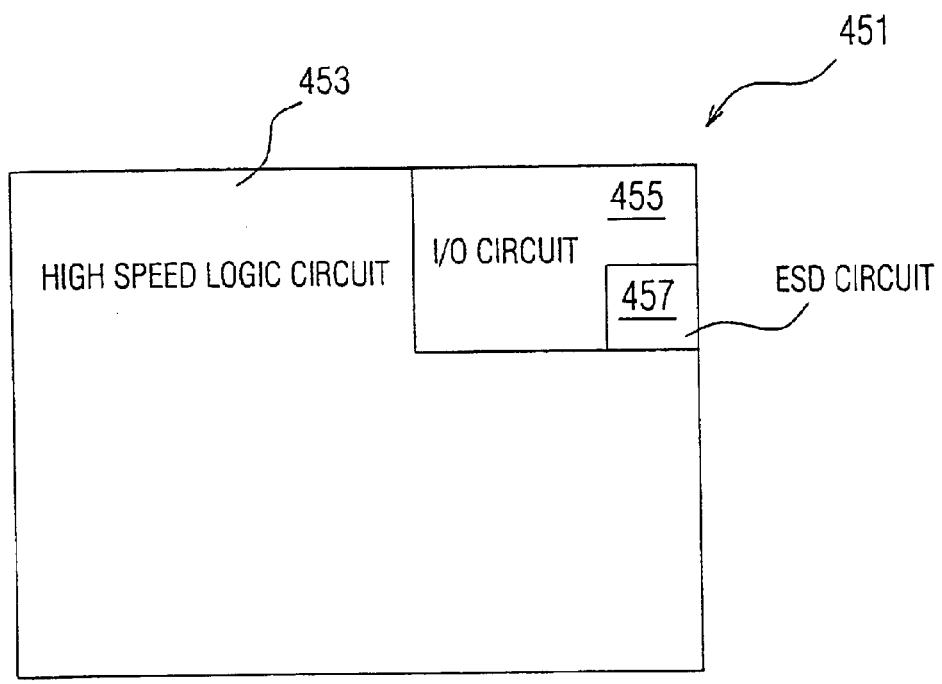
FIG. 7 is a plan view illustrating the semiconductor device manufacturing method according to the modification of the third embodiment of the invention.

FIG. 7 is a plan view showing the outline structure of a high speed logic integrated circuit including an ESD circuit.

As shown in FIG. 7, a logic integrated circuit 451 of the embodiment includes a high speed logic circuit 453 and an input/output (I/O) circuit 455. The I/O circuit 455 includes an ESD circuit 457. The high speed logic circuit 453 is mainly constituted of high speed transistors having a short gate length. The I/O circuit 455 is mainly constituted of high voltage transistors having a relatively long gate length. The ESD circuit 457 is also mainly constituted of high voltage transistors having a relatively long gate length. Resistor elements may be formed in each circuit.

With reference to FIGS. 8A to 8J, the manufacture processes for the high speed logic circuit including the ESD circuit and resistor elements will be described.

Figure 8A:
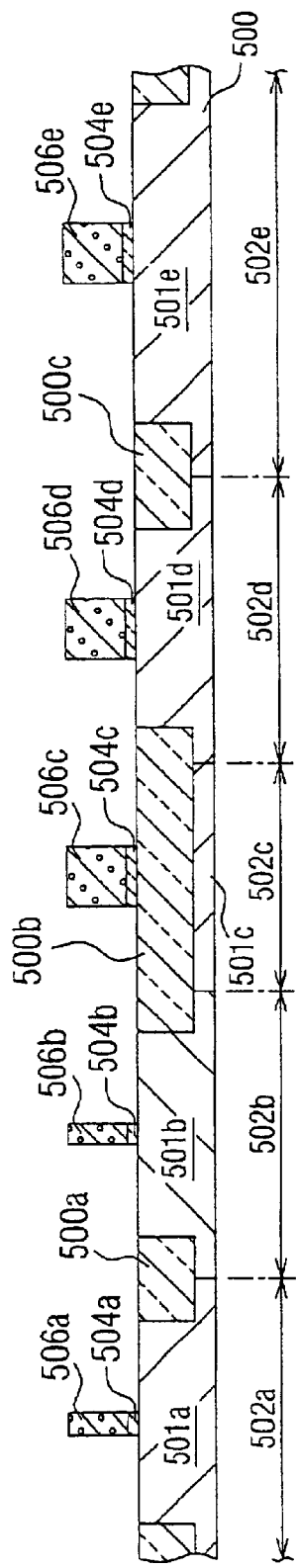

As shown in FIG. 8A, first element regions 502a and 502b, a second element region 502c, a third element region 502d and a fourth element region 502e are defined in a silicon substrate 500 by element separation regions 500a to 500c.

The first and second element regions 502a and 502b are formed with high speed transistors, and are considered as one integrated region in this embodiment. In the following description, although only n-type MOSFET's are formed in the third and fourth element regions 502d and 502e, only p-type MOSFET's or both n- and p-type MOSFETs may be formed.

In the surface layer of the substrate 500, a p-type region 501a and an n-type region 501b having different conductivity types are formed in the first element regions 502a and 502b, respectively. An element separation region 500b is formed in the surface layer of the substrate 500 in the second element region 502c by shallow trench isolation (STI). In the third and fourth element regions 502d and 502e, p-type wells 501d and 501e are formed.

Thereafter, on the surface of the substrate 500, for example, a silicon oxide film and a polysilicon film are deposited. The silicon oxide film may be formed by thermal oxidation. In this case, the silicon oxide film is not formed in the element separation regions 500a and 500b.

The polysilicon film and silicon oxide film are anisotropically etched to form a gate structure having a gate insulating layer 504a and a gate electrode layer 506a in the first element region 502a and to form a gate structure having a gate insulating layer 504b and a gate electrode layer 506b in the first element region 502b. In the second element region 502c, a lamination structure of a silicon oxide layer 504c and a polysilicon layer 506c is formed. Gate insulating films 504d and 504e thicker than the gate insulating films 504a and 504b are formed in the third and fourth element regions 502d and 502e.

Figure 8B:
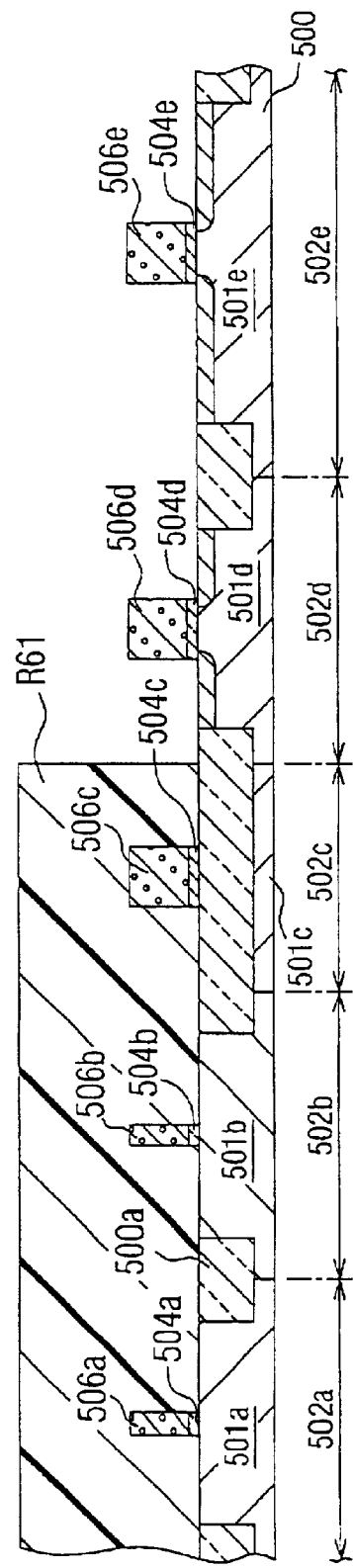

As shown in FIG. 8B, a resist mask R61 is formed covering the first and second element regions 502a and 502b and second element region 502c and having an opening in the third and fourth element regions 502d and 502e. By using the resist mask R61, P ions for SDE are implanted into the third and fourth element regions 502d and 502e under the conditions of an acceleration energy of 20 keV and a dose of $4\times10^{13}$ cm$^{-2}$. The resist mask R61 is thereafter removed.

Figure 8C:
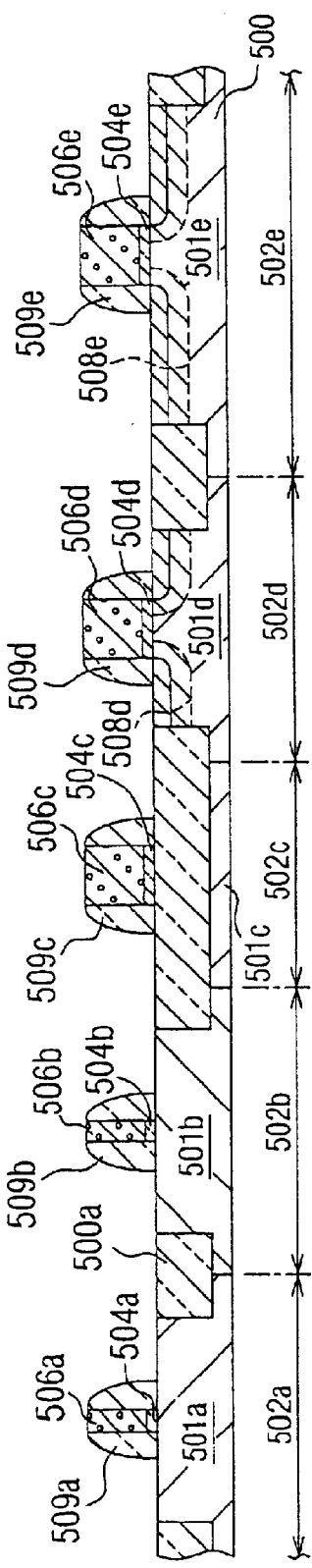

Next, as shown in FIG. 8C, an activation process for implanted P ions is performed. For example, this heat treatment is performed at 1000° C. for ten seconds by RTA. SDE regions 508d and 508e are therefore formed in the third and fourth element regions 502d and 502e.

Next, on the substrate 500, for example, a silicon nitride film is deposited. This silicon nitride film is etched by anisotropical etching such as RIE.

Side wall spaces 509a to 509e of silicon nitride are therefore left on the side walls of the gate electrodes in the first, third and fourth element regions 502a, 502b, 502d and 502e and on the side walls of the lamination structure in the second element region 502c. The activation process for implanted P ions by RTA may be dispensed with and the activation of implanted P ions may be done in the process of depositing the silicon nitride film.

It is preferable that both the activation processes are performed in such a manner that the SDE regions 508d and 508e are formed having an impurity profile broadening along the depth direction as indicated by broken lines and having a gentle concentration gradient.

Figure 8D:
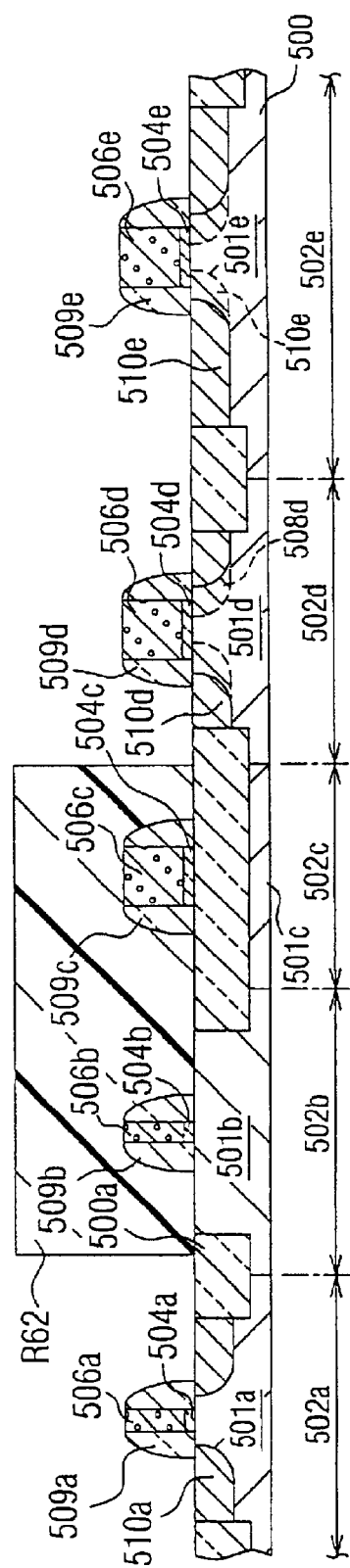

As shown in FIG. 8D, a resist mask R62 is formed by photolithography, the resist mask R62 covering the second element region 502c and one 502b of the first element regions (hereinafter called a PMOS region 502b) and having an opening in the other 502a of the first element regions (hereinafter called an NMOS region 502a) and an opening in the third and fourth element regions 502d and 502e.

Next, by using the resist mask R62, As ions are implanted into the NMOS regions 502a, 502d and 502e under the conditions of an acceleration energy of 30 keV and a dose of $5\times10^{15}$ cm$^{-2}$. If ion implantation is performed by leaving a silicon oxide film on the substrate, for example, by about 15 nm in thickness, the acceleration energy is raised to 40 keV to perform ion implantation. Next, the resist mask R62 is removed.

As shown in FIG. 8E, a resist mask R63 is formed covering the NMOS region 502a and third and fourth regions 502d and 502e and having an opening in the PMOS region 502b and second element region 502c. By using the resist mask R63, B ions are implanted under the conditions of an acceleration energy of 5 keV and a dose of $4\times10^{15}$ cm$^{-2}$. If ion implantation is performed by leaving a silicon oxide film on the substrate 500, for example, by about 15 nm in thickness, the acceleration energy is raised to 7 keV to perform ion implantation. B ions are therefore implanted into the regions where the source/drains are formed in the PMOS region 502b and into the polysilicon layer 506c to be used as a resistor element. Since the ion implantation is performed at the same time both for the source/drain regions in the PMOS region 502b and the resistor element polysilicon layer 506c, another ion implantation process for the resistor element is not necessary. In this process, although the ion implantation is performed at the same time both for the source/drain regions 510b in the PMOS region 502b and the resistor element polysilicon layer 506c in the third element region 502c, an ion implantation process for the source/drain regions in the NMOS region 502a and the resistor element polysilicon layer 506c in the third element region 502c may be performed. Next, the resist mask R63 is removed. Heat treatment is performed to activate ions implanted into the substrate 500 (regions 510b for the source/drain regions) and polysilicon layer 506c. For example, heat treatment is performed at 1050° C. for 3 seconds by RTA. Thereafter, the side wall spacers 509a, 509b, 509c, 509d and 509e are removed.

As shown in FIG. 8F, the source/drain regions 510a and 510b are therefore formed in the NMOS region 502a and PMOS region 502b in the first element region and the resistance element polysilicon layer 506c has a low resistance.

In the above processes, silicon nitride is used as the material of the side wall spacer and silicon oxide (having different etching characteristics from silicon nitride) is used as the material filled in the element separation region. Therefore, the side wall spacers can be removed selectively relative to the silicon oxide in the element separation region.

Figure 8G:
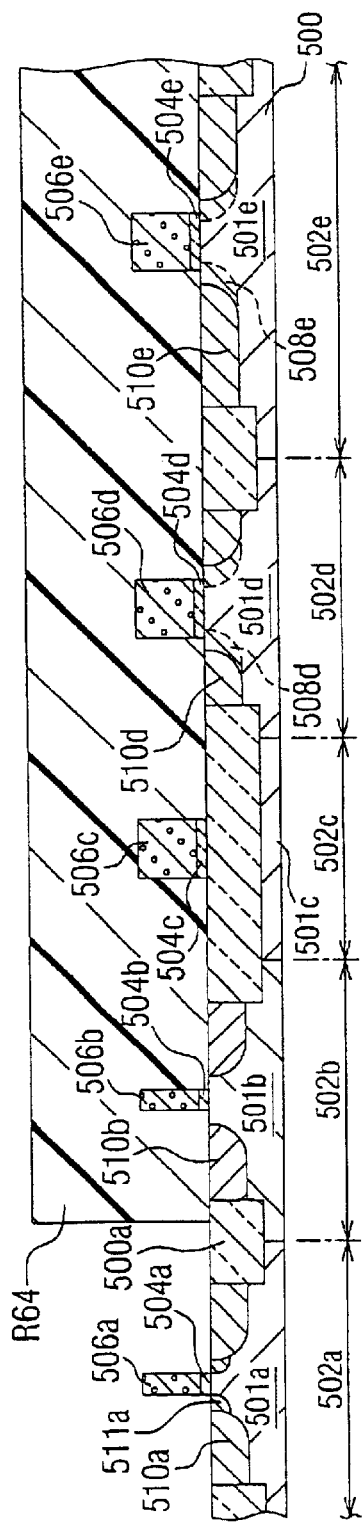

As shown in FIG. 8G, a resist mask R64 is formed having an opening in the NMOS region 502a. By using the resist mask R64 and gate electrode 506a as a mask, ions are implanted into the NMOS region 502a to form SDE. For example, this ion implantation is performed by using As ions under the conditions of an acceleration energy of 5 keV and a dose of $1\times10^{15}$ cm$^{-2}$. The resist mask R64 is thereafter removed.

Figure 8H:
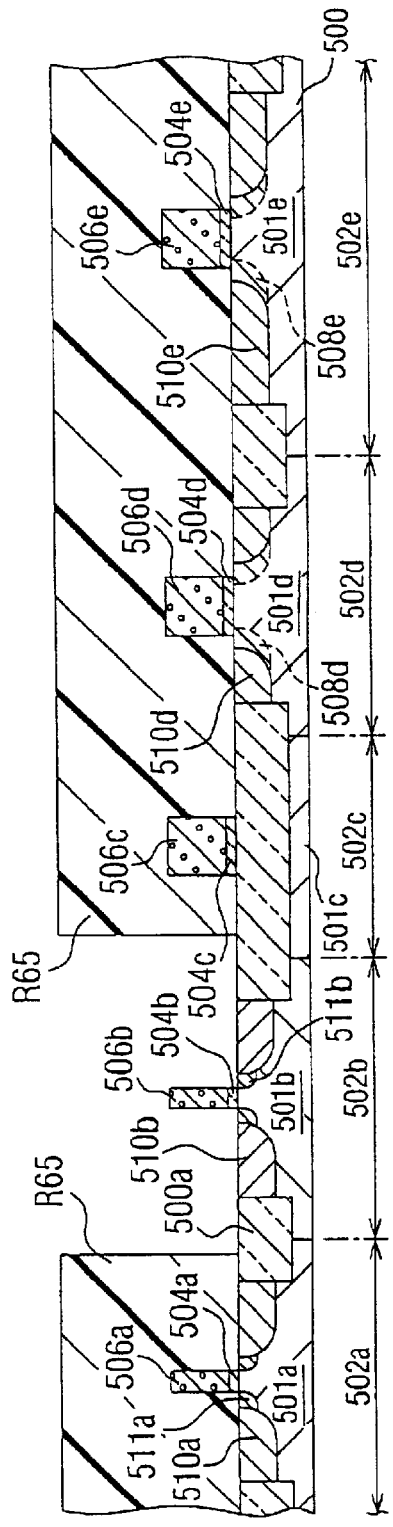

Next, as shown in FIG. 8H, a resist mask R65 is formed having an opening in the PMOS region 502b. By using the resist mask R65 and gate electrode 506b as a mask, ions are implanted into the PMOS region 502b to form SDE. For example, this ion implantation is performed by using B ions under the conditions of an acceleration energy of 0.5 keV and a dose of $1\times10^{14}$ cm$^{-2}$. After the resist mask R47 is removed, heat treatment is performed to activate ions implanted for SDE. For example, the heat treatment is performed at 1000° C. for 3 seconds by RTA.

Thereafter, an insulating film for forming side wall spacers, e.g., a silicon nitride film, is deposited on the substrate. A resist mask R66 and a resist mask R66-2 are formed. The resist mask R66 covers the second element region 502c, and the resist mask R66-2 covers a partial area, spaced away from the gate electrode 506e by some distance, of the drain region of the source/drain regions 510e of an ESD transistor to be formed in the fourth element region 504e.

By using the resist masks R66 and R66-2, the silicon nitride film is etched by anisotropical etching such as RIE.

Figure 8I:
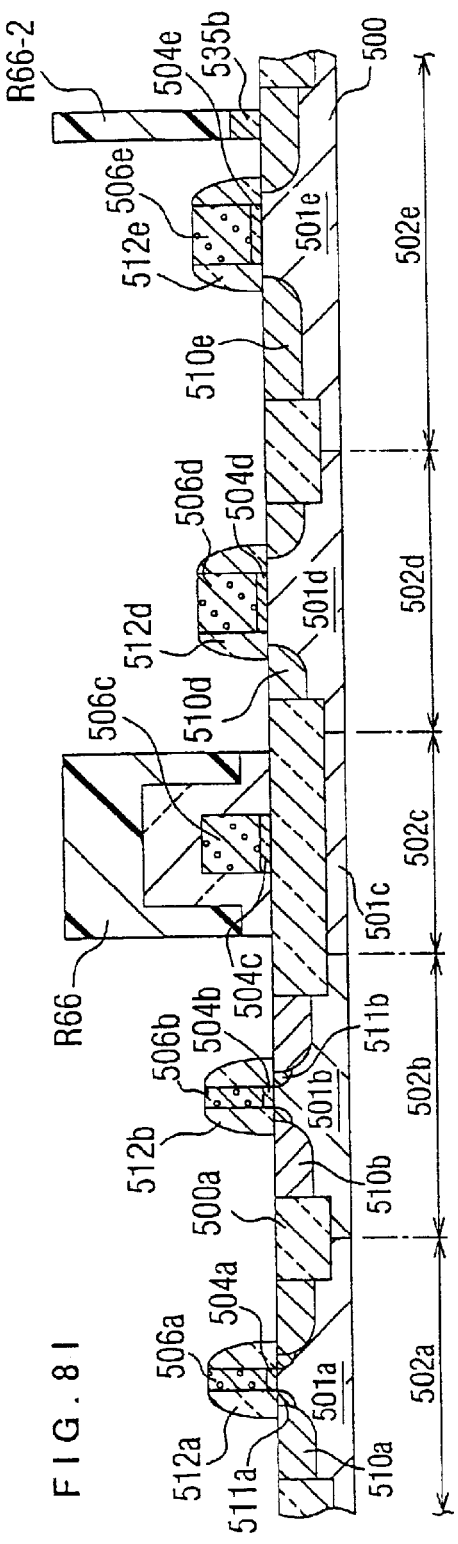
Figure 8J:
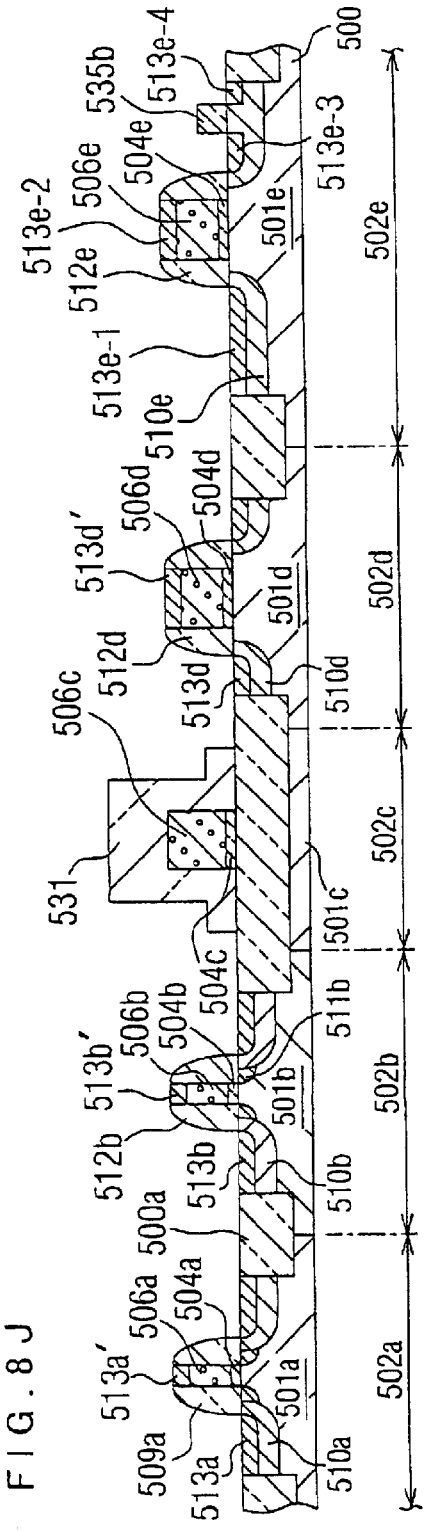
Figure 9A:
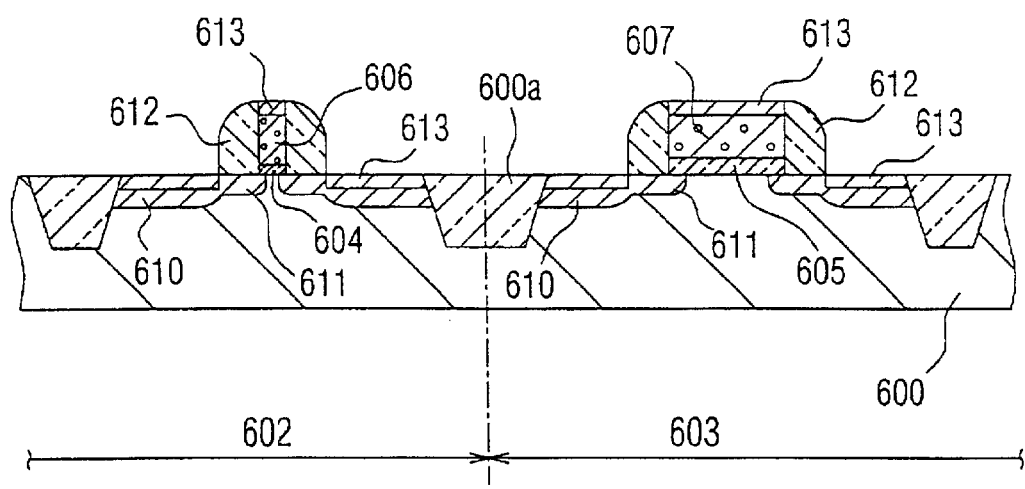
FIGS. 9A and 9B are cross sectional views illustrating problems associated with conventional semiconductor devices.
Figure 9B:
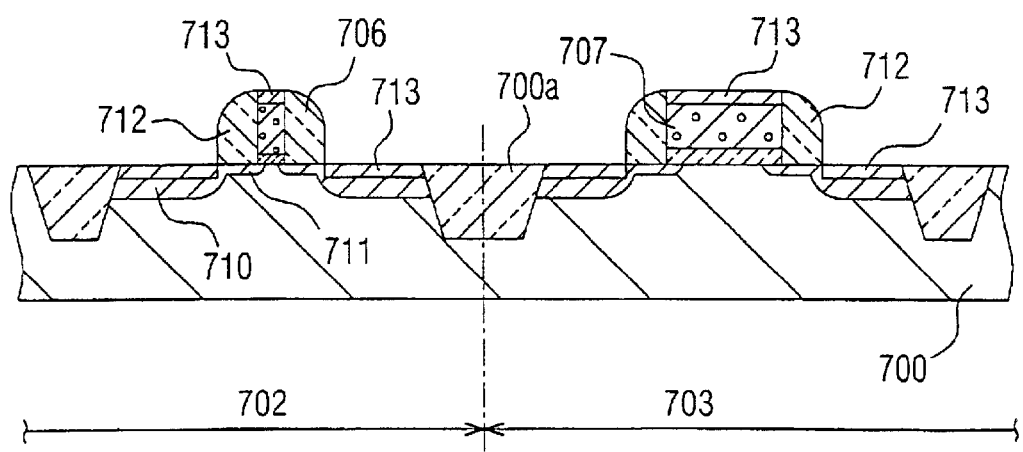

As shown in FIGS. 8I and 8J, side wall spacers 512a, 512b, 512d and 512e are therefore formed on the side walls of the gate electrodes in the high speed NMOS region 502a and PMOS region 502b (first element region) and the high voltage transistor region (third element region) 502d and ESD transistor region (fourth element region) 502e. In addition, a nitride silicon film 531 is left in the resistor element region (second element region) 502c, and a silicon nitride film 535b is left in a partial area of the drain region in the ESD region (fourth element region) 502e. The resist masks R66 and R66-2 are thereafter removed.

For example, a Co layer is deposited over the substrate.

Next, a salicide (self-aligned silicide) process is performed. For example, a Co metal film is deposited over the substrate and heat treatment is performed under predetermined conditions. In the regions where the Co metal layer directly contacts the polysilicon layer or silicon semiconductor layer, a metal silicide ($CoSi_2$) layer 513 is formed. An unreacted Co layer deposited on the side wall spacers and protective films 531 and 535b is selectively removed by using, for example, hydrofluoric acid containing etchant.

With the above processes, the silicide layer is formed on the gate electrode and source/drain regions of each of high speed transistors and high voltage transistors, whereas it is not formed on the polysilicon layer constituting the resistor element and the partial area of the drain region of an ESD transistor. It is therefore possible to prevent the resistor element from having too low a resistance and to form an ESD transistor. In FIG. 8I, the silicidation preventing mask R66-2 is formed in the central area of the drain region 510e of the ESD transistor, because the alignment margin of this mask is made larger (than that of the gate electrode forming mask).

Thereafter, wiring patterns between elements are formed by a well-known process of forming interlayer insulating films and wiring patterns, to complete an integrated circuit.

In the above processes, the ion implantation process for the source/drain regions in the NMOS region is performed first, and then the ion implantation process for the source/drain regions in the PMOS region is performed. The order of ion implantation may be reversed. The order of ion implantation for SDE may also be reversed for the PMOS and NMOS regions.

According to the techniques of the fourth embodiment, the ion implantation for forming transistor source/drain regions, the ion implantation for lowering the resistance of a polysilicon layer to be used as a resistor element, and the ion implantation for forming the source/drain regions of each of high voltage transistors and ESD transistors can be performed by the same process. The manufacture processes can therefore be simplified.

By forming a resistor element by polysilicon, a junction capacitance by a p-n junction formed in the substrate can be reduced. After the SDE regions for the high voltage transistor and ESD transistor are formed, the SDE region for the high speed transistor is formed so that the impurity profiles of the SDE regions of the latter and former transistors can be designed independently. According to the techniques of this embodiment, it is possible to form a gentle concentration gradient of a p-n junction between the substrate and the SDE region of each of the high voltage and ESD transistors and to form a sharp concentration gradient of a p-n junction between the substrate and the SDE region of each high speed transistor.

Therefore, for the high voltage transistor and ESD transistor, a reduction of the on-current to be caused by hot carriers can be suppressed, and for the high speed transistor, the source resistance can be lowered and the short channel effects can be suppressed.

The gate insulating films of the high breakdown voltage transistor and ESD transistor can be prevented from being deteriorated by making the gate insulating films of the high breakdown voltage transistor and ESD transistor thicker than that of the high speed transistor.

The present invention has been described in connection with the preferred embodiments. The invention is not limited only to the above embodiments. It is apparent that various modifications, improvements, combinations, and the like can be made by those skilled in the art.

What we claim are:

1. A method of manufacturing a semiconductor device, comprising the steps of:
   (a) preparing a semiconductor substrate having first and second regions of a first conductivity type defined by isolation regions in a principal surface area of the semiconductor substrate;
   (b) forming at least a first gate electrode in a partial area of the first region;
   (c) implanting impurities of a second conductivity type opposite to said first conductivity type into a surface layer of said second region, and thereafter executing a first activation process to form first impurity diffusion region shallower than said isolation regions, the first impurity diffusion region being directly surrounded by said second region of the first conductivity type, and providing a current path for charge carriers of said second conductivity type;
   (d) forming first spacer film on side surface of said first gate electrode;
   (e) by using said first gate electrode and said first spacer film as a mask, implanting impurities of said second conductivity type into a surface layer of said first region, and thereafter executing a second activation process to form a second impurity diffusion region;
   (f) removing said first spacer film; and
   (g) by using said first gate electrode as a mask, implanting impurities of said second conductivity type into a surface layer in said first region, and thereafter executing a third activation process to form third impurity diffusion region, wherein said third activation process is executed so that the gradient of an impurity concentration distribution in a p-n junction formed by the third impurity diffusion region becomes steeper than the gradient of an impurity concentration distribution in a p-n junction formed by said first impurity diffusion region formed by said first activation process.

2. A method of manufacturing a semiconductor device according to claim 1, wherein each of said first to third activation processes includes a thermal treatment at a temperature at least equal to 750° C.

3. A method of manufacturing a semiconductor device according to claim 1, wherein said third activation process is a laser thermal process.

4. A method of manufacturing a semiconductor device according to claim 1, said step (b) forms first and second gate electrodes in respective partial areas of said first and second active regions, and wherein the gate length of said first gate electrode is shorter than the gate length of said second gate electrode.

5. A method of manufacturing a semiconductor device according to claim 1, wherein said step (c) forms a resistor.

6. A method of manufacturing a semiconductor device according to claim 5, wherein said step (d) also forms a silicidation preventing film on the first impurity diffusion region.

7. A method of manufacturing a semiconductor device according to claim 3, wherein said first and second activating processes are done by rapid thermal annealing.

8. A method of manufacturing a semiconductor device according to claim 1, wherein the gradient of the impurity concentration distribution of the p-n junction formed by the third impurity diffusion region is steeper than the gradient of the impurity concentration distribution of the p-n junction formed by the second impurity diffusion region.

* * * * *